United States Patent
Aziz et al.

(10) Patent No.: US 6,841,932 B2
(45) Date of Patent: Jan. 11, 2005

(54) DISPLAY DEVICES WITH ORGANIC-METAL MIXED LAYER

(75) Inventors: Hany Aziz, Burlington (CA); Yoon-Fei Liew, Singapore (SG); Zoran D. Popovic, Mississauga (CA); Nan-Xing Hu, Oakville (CA); Anthony J. Paine, Mississauga (CA)

(73) Assignee: Xerox Corporation, Stamford, CT (US)

( * ) Notice: Subject to any disclaimer, the term of this patent is extended or adjusted under 35 U.S.C. 154(b) by 137 days.

(21) Appl. No.: 10/117,812

(22) Filed: Apr. 5, 2002

(65) Prior Publication Data

US 2002/0180349 A1 Dec. 5, 2002

Related U.S. Application Data

(63) Continuation-in-part of application No. 09/800,716, filed on Mar. 8, 2001, now abandoned.

(51) Int. Cl.$^7$ ................................................. H01J 1/62
(52) U.S. Cl. ...................... 313/503; 313/502; 313/504; 428/690; 428/917
(58) Field of Search ................................. 313/502, 503, 313/504, 498, 499, 505, 506, 511, 311; 428/690, 917, 212; 315/169.3; 359/58, 60

(56) References Cited

U.S. PATENT DOCUMENTS

| | | | |
|---|---|---|---|
| 3,172,862 A | 3/1965 | Gurnee et al. | 252/301.16 |
| 4,287,449 A | 9/1981 | Takeda et al. | 313/509 |
| 4,356,429 A | 10/1982 | Tang | 313/503 |
| 4,539,507 A | 9/1985 | VanSlyke et al. | 313/504 |
| 4,652,794 A * | 3/1987 | Waite et al. | 313/506 |
| 4,720,432 A | 1/1988 | VanSlyke et al. | 428/457 |
| 4,767,966 A * | 8/1988 | Simopoulos et al. | 313/509 |
| 4,769,292 A | 9/1988 | Tang et al. | 428/690 |
| 4,885,211 A | 12/1989 | Tang et al. | 428/457 |
| 5,049,780 A | 9/1991 | Dobrowolski et al. | 313/509 |
| 5,141,671 A | 8/1992 | Bryan et al. | 252/301.16 |
| 5,150,006 A | 9/1992 | Van Slyke et al. | 313/504 |
| 5,151,629 A | 9/1992 | VanSlyke | 313/504 |
| 5,227,252 A | 7/1993 | Murayama et al. | 428/690 |
| 5,247,190 A | 9/1993 | Friend et al. | 257/40 |

(List continued on next page.)

FOREIGN PATENT DOCUMENTS

| | | |
|---|---|---|
| EP | 0 977 287 A2 | 2/2000 |
| EP | 0 977 288 A2 | 2/2000 |
| EP | 1 160 890 A2 | 12/2001 |
| JP | 6-187913 | 7/1994 |
| JP | 8-222374 | 8/1996 |
| WO | WO 01/06816 A1 | 1/2001 |
| WO | WO 01/08240 A1 | 2/2001 |

OTHER PUBLICATIONS

Liew et al., U.S. Applictaion Ser. No. 09/800,716, Filed Mar. 8, 2001, "Cathodes for Electroluminescent Devices Having Improved Contrast and Reduced Dark Spot Growth" (D/A1034).

(List continued on next page.)

Primary Examiner—Nimeshkumar D. Patel
Assistant Examiner—Sharlene Leurig
(74) Attorney, Agent, or Firm—Zosan S. Soong

(57) ABSTRACT

A display device composed of: (a) a cathode; (b) an anode; (c) a luminescent region between the cathode and the anode; and an optional region adjacent one of the electrodes, wherein at least one of the cathode, the anode, the luminescent region, and the optional region includes a metal-organic mixed layer composed of: (i) an inorganic metal containing material, (ii) an organic material, and (iii) optionally, at least one component selected from the group consisting of metals, organic materials, and inorganic materials.

49 Claims, 12 Drawing Sheets

U.S. PATENT DOCUMENTS

| | | | | |
|---|---|---|---|---|
| 5,276,381 | A | | 1/1994 | Wakimoto et al. .......... 313/504 |
| 5,516,577 | A | | 5/1996 | Matsuura et al. ........... 428/212 |
| 5,593,788 | A | | 1/1997 | Shi et al. ..................... 428/690 |
| 5,601,903 | A | | 2/1997 | Fujii et al. .................. 428/212 |
| 5,728,801 | A | | 3/1998 | Wu et al. .................... 528/422 |
| 5,846,666 | A | | 12/1998 | Hu et al. ..................... 428/690 |
| 5,935,720 | A | | 8/1999 | Chen et al. ................. 428/690 |
| 5,942,340 | A | | 8/1999 | Hu et al. ..................... 428/690 |
| 5,952,115 | A | | 9/1999 | Hu et al. ..................... 428/690 |
| 6,023,073 | A | | 2/2000 | Strite .......................... 257/40 |
| 6,054,809 | A | * | 4/2000 | Haynes et al. .............. 313/505 |
| 6,057,048 | A | | 5/2000 | Hu et al. ..................... 428/690 |
| 6,130,001 | A | * | 10/2000 | Shi et al. .................... 428/690 |
| 6,274,979 | B1 | * | 8/2001 | Celii et al. .................. 313/506 |
| 2001/0053462 | A1 | * | 12/2001 | Mishima ..................... 313/504 |
| 2003/0038593 | A1 | | 2/2003 | Aziz et al. .................. 313/506 |

OTHER PUBLICATIONS

Burrows et al., "Realiabilty and Degradation of Organic Light Emitting Devices," Appl. Phys. Lett. vol. 65, p. 2922–2924 (1994).

Liang–Sun Hung et al., "Reduction of Ambient Light Reflection in Organic Light–Emitting Diodes," Advanced Materials vol. 13, pp. 1787–1790 (2001).

Liang–Sun Hung et al., U.S. Application Ser. No. 09/577, 092 (filed May 24, 2000).

O. Renault et al., "A low reflectivity multilayer cathode for organic light–emitting diodes," Thin Solid Films, vol. 379, pp. 195–198 (2000).

David Johnson et al., Technical Paper 33.3, "Contrast Enhancement of OLED Displays," http://www.luxell.com/pdfs/OLED_tech_ppr.pdf, pp. 1–3 (Apr. 2001).

Junji Kido et al., "Bright organic electroluminescent devices having a metal–doped electron–injecting layer," Applied Physics Letters vol. 73, pp.2866–2868 (1998).

Jae–Gyoung Lee et al., "Mixing effect of chelate complex and metal in organic light–emitting diodes," Applied Physics Letters vol. 72, pp. 1757–1759 (1998).

Jingsong Huang et al., "Low–voltage organic electroluminescent devices using pin structures," Applied Physics Letters vol. 80, pp. 139–141 (2002).

L.S. Hung et al., "Sputter deposition of cathodes in organic light emitting diodes," Applied Physics Letters, vol. 86, pp. 4607–4612 (1999).

Hany Aziz et al., U.S. Application Ser. No. 09/935,031, filed Aug. 22, 2001.

Bernius et al., "Development progress of electroluminescent polymeric materials and devices," SPIE Conference on Organic Light Emitting Materials and Devices III, Denver, Colorado, Jul. 1999, SPIE, vol. 3797, pp. 129–137.

Baldo et al., "Highly efficient organic phosphorescent emmision from organic electroluminescent devices," Nature vol. 395, pp. 151–154 (1998).

Kido et al., "White light emitting organic electroluminescent device using lanthanide complexes," Jpn. J. Appl. Phys. vol. 35, pp. L394–L396 (1996).

* cited by examiner

DISPLAY DEVICES WITH ORGANIC-METAL MIXED LAYER

CROSS REFERENCE TO RELATED APPLICATIONS

This application is a continuation-in-part application of parent U.S. application Ser. No. 09/800,716 (filed Mar. 8, 2001) now abandoned, from which priority is claimed, the disclosure of which is totally incorporated herein by reference.

BACKGROUND OF THE INVENTION

Organic light emitting devices (OLEDs) represent a promising technology for display applications. A typical organic light emitting device includes a first electrode; a luminescent region comprising one or more electroluminescent organic material(s); and a second electrode; wherein one of the first electrode and the second electrode functions as a hole-injecting anode, and the other electrode functions as an electron-injecting cathode; and wherein one of the first electrode and the second electrode is a front electrode, and the other electrode is a back electrode. The front electrode is transparent (or at least partially transparent) while the back electrode is usually highly reflective to light. When a voltage is applied across the first and second electrodes, light is emitted from the luminescent region and through the transparent front electrode. When viewed under high ambient illumination, the reflective back electrode reflects a substantial amount of the ambient illumination to the observer, which results in higher ratios of reflected illumination as compared to the device's own emission, resulting in "washout" of the displayed image.

In order to improve the contrast of electroluminescent displays in general, light absorbing layers as described, for example, in U.S. Pat. No. 4,287,449, or optical interference members as described, for example, in U.S. Pat. No. 5,049,780, have been used to reduce the ambient illumination reflection.

Another problem of known organic light emitting devices originates from the use of metals with low work functions, and hence high reactivity, in the cathodes. Due to their high reactivity, such cathode materials are unstable in ambient conditions and react with atmospheric $O_2$ and water to form non-emissive dark spots. See, for example, Burrows et al., "Reliability and Degradation of Organic Light Emitting Devices," Appl. Phys. Lett. Vol. 65, pp. 2922–2924 (1994). To reduce such ambient effects, organic light emitting devices are typically hermetically sealed, immediately after fabrication, under stringent conditions, such as, for example, less than 10 ppm moisture atmospheres.

Thus, there is a need which the present invention addresses for new display devices that avoid or minimize a number of the above mentioned problems. In particular, as described herein, the present display devices provide in embodiments a reduced light reflection.

Other documents that may be relevant to the present invention include the following:

Liang-Sun Hung et al., "Reduction of Ambient Light Reflection in Organic Light-Emitting Diodes," Advanced Materials Vol. 13, pp.1787–1790 (2001);

Liang-Sun Hung et al., U.S. application Ser. No. 09/577,092 (filed May 24, 2000);

EP 1 160 890 A2 (claims priority based on above U.S. application Ser. No. 09/577,092;

Japanese laid open patent document No. 8-222374 (laid open date Aug. 30, 1996);

O. Renault et al., "A low reflectivity multilayer cathode for organic light-emitting diodes," Thin Solid Films, Vol. 379, pp.195–198 (2000);

WO 01/08240 A1;

WO 01/06816 A1;

David Johnson et al., Technical Paper 33.3, "Contrast Enhancement of OLED Displays," http://www.luxell.com/pdfs/OLED_tech_ppr.pdf, pp. 1–3 (April 2001);

Junji Kido et al., "Bright organic electroluminescent devices having a metal-doped electron-injecting layer," Applied Physics Letters Vol. 73, pp.2866–2868 (1998);

Jae-Gyoung Lee et al., "Mixing effect of chelate complex and metal in organic light-emitting diodes," Applied Physics Letters Vol. 72, pp.1757–1759 (1998);

Jingsong Huang et al., "Low-voltage organic electroluminescent devices using pin structures," Applied Physics Letters Vol. 80, pp.139–141 (2002);

L. S. Hung et al., "Sputter deposition of cathodes in organic light emitting diodes," Applied Physics Letters, Vol. 86, pp. 4607–4612 (1999);

EP 0 977 287 A2;

EP 0 977 288 A2;

Hany Aziz et al., U.S. application Ser. No. 09/935,031, filed Aug. 22, 2001.

Other documents that may be relevant to the present application were submitted in parent U.S. application Ser. No. 09/800,716 (filed Mar. 8, 2001), such other documents being:

U.S. Pat. No. 4,885,211;
U.S. Pat. No. 5,247,190;
U.S. Pat. No. 4,539,507;
U.S. Pat. No. 5,151,629;
U.S. Pat. No. 5,150,006;
U.S. Pat. No. 5,141,671;
U.S. Pat. No. 5,846,666;
U.S. Pat. No. 5,516,577;
U.S. Pat. No. 6,057,048
U.S. Pat. No. 5,227,252;
U.S. Pat. No. 5,276,381;
U.S. Pat. No. 5,593,788;
U.S. Pat. No. 3,172,862;
U.S. Pat. No. 4,356,429;
U.S. Pat. No. 5,601,903;
U.S. Pat. No. 5,935,720;
U.S. Pat. No. 5,728,801;
U.S. Pat. No. 5,942,340;
U.S. Pat. No. 5,952,115;
U.S. Pat. No. 4,720,432;
U.S. Pat. No. 4,769,292;
U.S. Pat. No. 6,130,001;

Bernius et al., "developmental progress of electroluminescent polymeric materials and devices," SPIE Conference on Organic Light Emitting Materials and Devices III, Denver, Colo., July 1999, SPIE, Vol. 3797, pp. 129–137;

Baldo et al., "highly efficient organic phosphorescent emission from organic electroluminescent devices," Nature Vol. 395, pp. 151–154 (1998);

Kido et al., "white light emitting organic electroluminescent device using lanthanide complexes," Jpn. J. Appl. Phys. Vol. 35, pp. L394–L396 (1996);

SUMMARY OF THE INVENTION

The present invention is accomplished in embodiments by providing display device comprising:

(a) a cathode;
(b) an anode; and (c) a luminescent region between the cathode and the anode;

wherein at least one of the cathode, the anode, and the luminescent region comprises a binary metal-organic mixed layer consisting of:
(i) a single inorganic metal containing material, wherein the metal of the inorganic metal containing material is selected from the group consisting of Cu, Ag, Au, Ni, Pd, Pt, Se, and Te, and
(ii) a single organic material.

There is also provided in embodiments, a display device comprising:
(a) a cathode;
(b) an anode;
(c) a luminescent region between the cathode and the anode; and
(d) a region adjacent an electrode selected from the group consisting of the cathode and the anode, wherein the region includes a metal-organic mixed layer including:
(i) an inorganic metal containing material,
(ii) an organic material, and
(iii) optionally at least one component selected from the group consisting of metals, organic materials, and inorganic materials.

In further embodiments of the present invention, there is provided a display device comprising:
(a) a cathode;
(b) an anode; and
(c) a luminescent region between the cathode and the anode;

wherein at least one of the cathode, the anode, and the luminescent region comprises a metal-organic mixed layer including:
(i) an inorganic metal containing material,
(ii) an organic material, and
(iii) at least one component selected from the group consisting of metals, organic materials, and inorganic materials.

In still other embodiments, there is provided an electroluminescent device comprising:
(a) a cathode;
(b) an anode; and
(c) a luminescent region between the cathode and the anode;

wherein the cathode comprises a metal-organic mixed layer including:
(i) a metal,
(ii) an organic material, and
(iii) at least one component selected from the group consisting of metals, organic materials, and inorganic materials.

BRIEF DESCRIPTION OF THE DRAWINGS

Other aspects of the present invention will become apparent as the following description proceeds and upon reference to the Figures which represent illustrative embodiments.

Unless otherwise noted, the same reference numeral in different Figures refers to the same or similar feature.

DETAILED DESCRIPTION

This invention in embodiments provides cathodes for electroluminescent devices. This invention in embodiments also provides electroluminescent devices comprising the cathodes. This invention in embodiments also provides methods for forming the cathodes.

Cathodes according to embodiments of this invention can be used for example in electroluminescent devices and, more specifically, in organic electroluminescent devices (i.e., "organic light emitting devices" or OLEDs). The cathodes can provide advantages including reduced light reflection, and hence improved contrast. The cathodes can also provide reduced growth rates of dark spots. Dark spots result from the exposure of organic light emitting devices to ambient conditions.

Figure 1:
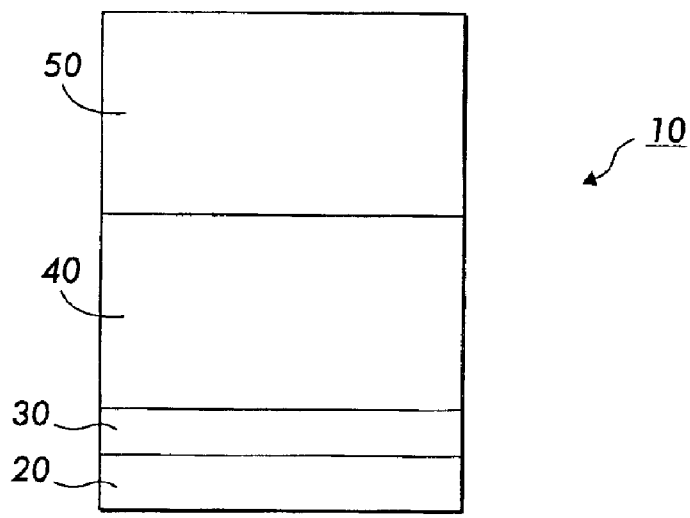
FIG. 1 illustrates an organic light emitting device comprising a cathode according to an embodiment of this invention.

An organic light emitting device 10 comprising an exemplary embodiment of a cathode according to this invention is shown in FIG. 1. The organic light emitting device 10 is formed over a substrate 20. The substrate 20 is shown at the bottom for illustration only. Those having ordinary skill in the art will understand that the organic light emitting device 10, as well as other organic light emitting devices according to this invention described below, can be used with substrates having any other suitable location relative to the organic light emitting devices. The organic light emitting device 10 comprises an anode 30; a luminescent region 40 comprising an organic luminescent material on the anode 30; and the cathode 50 over the luminescent region 40.

The cathode 50 comprises a metal-organic mixed layer (MOML). The metal-organic mixed layer comprises at least two components, especially at least three components; namely, (i) at least one inorganic metal containing material first component, (ii) at least one organic material second component, and optionally (iii) at least one third component that can be selected from metals, organic materials and/or inorganic materials.

In some embodiments, the cathode 50 can consist essentially of the metal-organic mixed layer. In such embodiments, the metal-organic mixed layer can comprise the components (i), (ii) and (iii), or it can consist essentially of these components.

Figure 2:
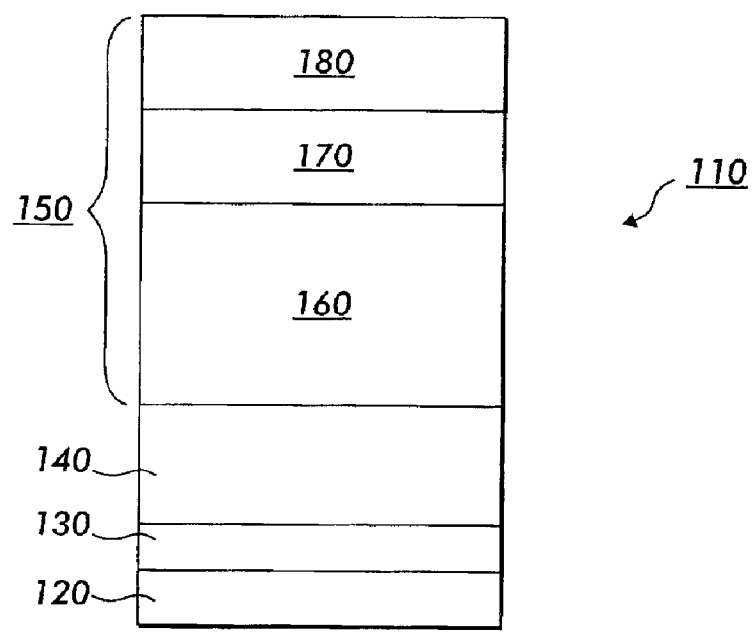
FIG. 2 illustrates an organic light emitting device comprising a cathode according to another embodiment of this invention.

FIG. 2 shows an organic light emitting device 110 comprising a cathode 150 according to another embodiment of this invention. The cathode 150 comprises one or more optional layers in addition to the metal-organic mixed layer. For example, the cathode can comprise one, two, three or more such optional additional layers. The organic light emitting device 110 is shown on a substrate 120. The organic light emitting device 110 comprises an anode 130; a luminescent region 140 on the anode 130; and the cathode 150 over the luminescent region 140. In this exemplary embodiment, the cathode 150 comprises a metal-organic mixed layer 160 and two additional layers 170 and 180 formed over the metal-organic mixed layer 160.

The metal-organic mixed layer 160 comprises at least three components; namely, (i) at least one inorganic metal containing material first component, (ii) at least one organic material second component, and (iii) at least one third component that can be selected from metals, organic materials and/or inorganic materials.

In some embodiments, the metal-organic mixed layer can consist essentially of the components (i), (ii) and (iii).

In embodiments of the cathodes comprising one or more such additional layers, such as the cathode 150, the metal-organic mixed layer 160 acts as an electron injection contact. The metal-organic mixed layer 160 is formed to contact the luminescent region 140 of organic light emitting devices.

In embodiments of the cathodes according to this invention, the metal-organic mixed layer can comprise metals having a work function less than about 4 eV.

In such embodiments of the cathodes, the one or more additional layer(s) of the cathodes can comprise at least one metal and/or at least one inorganic material. Suitable exemplary metals that can be used in the additional layer(s) include, but are not limited to, Mg, Ag, Al, In, Ca, Sr, Au, Li, Cr and mixtures thereof. Suitable exemplary inorganic materials that can be used in the additional layer(s) include, but are not limited to, SiO, $SiO_2$, LiF, $MgF_2$ and mixtures thereof. For example, in the cathode 150 shown in FIG. 2, the layer 170 can comprise Mg:Ag, Mg, Ag, Al, In, Ca, Sr, Au, Li, Cr, SiO or $SiO_2$, and the layer 180 can comprise Ag, Al, In, SiO or $SiO_2$.

The one or more additional layer(s) can have the same or different functions from each other. For example, one or more additional layers of the cathode can comprise, or can consist essentially of, a metal to form a conductive layer with a low sheet resistance (e.g., <10Ω/square). In addition, one or more additional layers of the cathode can protect the metal-organic mixed layer from the ambient by forming a passivating layer (such as, for example, a moisture barrier) that prevents, or at least reduces, the permeation of ambient moisture to the MOML, the luminescent region and the anode. Also, one or more additional layers of the cathode can act as a thermal protective layer to provide protection from device shorting at elevated temperatures. For example, such protection can be provided at temperatures ranging from about 60° C. to about 110° C., as discussed in more detail in U.S. application Ser. No. 09/770,154, filed Jan. 26, 2001, which is incorporated herein by reference in its entirety.

Some embodiments of the cathodes according to this invention comprise a metal-organic mixed layer, which comprises at least one additional metal component. That is, the third component of the metal-organic mixed layer is at least one metal. Exemplary preferred embodiments of such cathodes comprise a metal-organic mixed layer including (1) Ag, (2) tris(8-hydroxyquinolinate) aluminum (AlQ3) and (3) Mg. However, in such embodiments, the third component can be any suitable one or more metal(s) and is not limited to Mg.

In some embodiments of cathodes according to this invention, Ag is needed to achieve desired contrast effects.

In cathodes and anodes according to this invention, both the thickness of the metal-organic mixed layer and the mixing ratio of the components of the metal-organic mixed layer are selected to achieve the desired cathode and anode performance; namely, increased contrast and reduced dark spot growth.

In embodiments, the thickness of the metal-organic mixed layer (MOML) can be for example from about 50 nm to about 1,000 nm, and particularly, from about 100 nm to about 600 nm.

Certain ranges of the mixing ratio of the different components of the metal-organic mixed layer are most effective in achieving the reduced rate of growth of dark spots in the luminescent region and/or the desired light reflection reducing properties of the metal-organic mixed layer needed to achieve improved contrast in organic light emitting devices. The preferred ranges of the mixing ratio depend on the selected components that form the metal-organic mixed layer.

For example, in metal-organic mixed layers formed of AlQ3+Mg+Ag, the mixing ratio of the components of the metal-organic mixed layer can be from about 20 volume % to about 80 volume % of AlQ3, from about 80 volume % to about 20 volume % of Mg, and from about 1 volume % to about 20 volume % of Ag. An illustrative range of the components is from about 30 volume % to about 50 volume % of AlQ3, from about 30 volume % to about 50 volume % of Mg, and from about 2 volume % to about 10 volume % of Ag. An exemplary preferred metal-organic mixed layer composition comprises about 47.4 volume % AlQ3, about 47.4 volume % Mg, and about 5.2 volume % Ag.

In other embodiments of the MOML according to this invention, AlQ3 can be replaced by other suitable metal complexes of 8-hydroxy quinolines.

The thickness of metal-organic mixed layers according to this invention can also be controlled to achieve the desired effects. For example, in metal-organic mixed layers comprised of AlQ3+Mg+Ag, the illustrative thickness range of the metal-organic mixed layer is from about 80 nm to about 300 nm.

Exemplary metal-organic mixed layers according to this invention comprise AlQ3+Mg+Ag, in a respective ratio of about 47.4 volume % of AlQ3: about 47.4 volume % of Mg: about 5.2 volume % of Ag. An illustrative thickness of metal-organic mixed layers having this composition is about 150 nm.

The metal-organic mixed layer can be formed by any suitable process. For example, the metal-organic mixed layer can be formed by thermal deposition. As stated above, the metal-organic mixed layer comprises at least two components, particularly at least three components. In embodiments, the at least two components can be co-evaporated. The deposition rate of each material component can be independently controlled to achieve the desired mixing ratio of the components in the metal-organic mixed layer.

In the organic light emitting devices 10, 110, the anode 30, 130, respectively, can comprise suitable positive charge injecting electrodes such as indium tin oxide (ITO), tin oxide, gold and platinum. Other suitable materials for forming the anode include, but are not limited to, electrically conductive carbon, π-conjugated polymers such as polyaniline, polythiophene, polypyrrole, and the like having, for example, a work function equal to, or greater than, about 4 eV, and preferably from about 4 eV to about 6 eV.

The anode 30, 130 can have any suitable form. A thin conductive layer can be coated onto a light transmissive substrate, such as, for example, a transparent or substantially transparent glass plate or plastic film. Embodiments of organic light emitting devices can comprise a light transmissive anode formed from tin oxide or indium tin oxide coated on glass. Also, very thin light-transparent metallic anodes having a thickness, for example, of less than about 200 Å, and, preferably, from about 75 Å to about 150 Å can be used. These thin anodes can comprise metals such as gold, palladium and the like. In addition, transparent or semi-transparent thin layers of conductive carbon or conjugated polymers such as polyaniline, polythiophene, polypyrrole and the like can be used to form anodes. These thin layers can have a thickness of, for example from 50 Å to about 175 Å. Additional suitable forms of the anode 30, 130 are disclosed in U.S. Pat. No. 4,885,211, which is incorporated herein by reference in its entirety.

The thickness of the anode 30, 130 can range from about 1 nm to about 5000 nm. The preferred thickness range of the anode is dependent on the optical constants of the anode material. One preferred thickness range of the anode is from about 30 nm to about 300 nm. Although less preferred, thicknesses outside of this range can also be used.

The luminescent region of the present display devices comprises in embodiments at least one electroluminescent organic material. Suitable organic electroluminescent materials include, for example, polyphenylenevinylenes, such as poly(p-phenylenevinylene) PPV, poly(2-methoxy-5-(2-ethylhexyloxy)1,4-phenylenevinylene) MEHPPV and poly (2,5-dialkoxyphenylenevinylene) PDMeOPV, and other materials disclosed in U.S Pat. No. 5,247,190, which is incorporated herein by reference in its entirety; polyphenylenes, such as poly(p-phenylene) PPP, ladder-poly-para-phenylene (LPPP), and poly(tetrahydropyrene) PTHP; and polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers (see e.g., Bernius et al., "Developmental Progress of Electroluminescent Polymeric Materials and Devices," Proceedings of SPIE Conference on Organic Light Emitting Materials and Devices III, Denver, Colo., July 1999, Volume 3797, p. 129).

Another class of organic electroluminescent materials that can be utilized in the luminescent region includes, but is not limited to, the metal oxinoid compounds as disclosed in U.S. Pat. Nos. 4,539,507; 5,151,629; 5,150,006; 5,141,671 and 5,846,666, each incorporated herein by reference in its entirety. Illustrative examples include tris(8-hydroxyquinolinate)aluminum (AlQ3), which is one preferred example, and bis(8-hydroxyquinolato)-(4-phenylphenolato)aluminum (BAlq) which is another preferred example. Other examples of this class of materials include tris(8-hydroxyquinolinate)gallium, bis(8-hydroxyquinolinate)magnesium, bis(8-hydroxyquinolinate) zinc, tris(5-methyl-8-hydroxyquinolinate)aluminum, tris(7-propyl-8-quinolinolato)aluminum, bis[benzo{f}-8-quinolinate]zinc, bis(10-hydroxybenzo[h]quinolinate) beryllium, and the like, and metal thioxinoid compounds disclosed in U.S. Pat. No. 5,846,666 (which is incorporated herein by reference in its entirety), such as metal thioxinoid compounds of bis(8-quinolinethiolato)zinc, bis(8-quinolinethiolato)cadmium, tris(8-quinolinethiolato) gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Preferred materials are bis(8-quinolinethiolato)zinc, bis(8-quinolinethiolato) cadmium, tris(8-quinolinethiolato)gallium, tris(8-quinolinethiolato)indium and bis[benzo{f}-8-quinolinethiolato]zinc.

More specifically, a class of organic electroluminescent materials that can be used in the luminescent region comprises stilbene derivatives, such as those disclosed in U.S. Pat. No. 5,516,577, incorporated herein by reference in it entirety. A preferred stilbene derivative is 4,4'-bis(2,2-diphenylvinyl)biphenyl.

Another class of suitable organic electroluminescent materials suitable for utilizing in the luminescent region is the oxadiazole metal chelates disclosed in U.S. application Ser. No. 08/829,398, which is incorporated herein by reference in its entirety. These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis[2-hydroxyphenyl)-5-phenyl -1,3,4-oxadiazolato]lithium; bis [2-(2-hydroxyphenyl)-5-p-tolyl-1,3,4-oxadiazolato]zinc; bis [2-(2-hydroxyphenyl)-5-p-tolyl-1,3,4-oxadiazolato] beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]

zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato] zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato] beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato] beryllium, and the like; and the triazines including those disclosed in U.S. application Ser. No. 09/489,144, filed on Jan. 21, 2000 and U.S. Pat. No. 6,057,048, each incorporated herein in its entirety.

The luminescent region can further include from about 0.01 weight percent to about 25 weight percent of a luminescent material as a dopant. Examples of dopant materials that can be utilized in the luminescent region are fluorescent materials, such as, for example, coumarin, dicyanomethylene pyranes, polymethine, oxabenzanthrane, xanthene, pyrylium, carbostyl, perylene, and the like. Another preferred class of fluorescent materials are quinacridone dyes. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, and the like as disclosed in U.S. Pat. Nos. 5,227,252; 5,276,381 and 5,593,788, each incorporated herein in its entirety. Another class of fluorescent materials that may be used is fused ring fluorescent dyes. Exemplary suitable fused ring fluorescent dyes include perylene, rubrene, anthracene, coronene, phenanthrecene, pyrene and the like, as disclosed in U.S. Pat. No. 3,172,862, which is incorporated herein by reference in its entirety. Also, fluorescent materials include butadienes, such as 1,4-diphenylbutadiene and tetraphenylbutadiene, and stilbenes, and the like, as disclosed in U.S. Pat. Nos. 4,356,429 and 5,516,577, each incorporated herein by reference in its entirety. Other examples of fluorescent materials that can be used are those disclosed in U.S. Pat. No. 5,601,903, which is incorporated herein by reference in its entirety.

Additionally, luminescent dopants that can be utilized in the light luminescent region are the fluorescent dyes disclosed in U.S. Pat. No. 5,935,720 (which is incorporated herein by reference in its entirety), such as, for example, 4-(dicyanomethylene)-2-I-propyl-6-(1,1,7,7-tetramethyljulolidyl-9-enyl)-4H-pyran (DCJTB); the lanthanide metal chelate complexes, such as for example, tris(acety lacetonato)(phenanthroline)terbium, tris(acetyl acetonato)(phenanthroline)europium, and tris(thenoyl trisfluoroacetonato)(phenanthroline)europium, and those disclosed in Kido et al., "White light emitting organic electroluminescent device using lanthanide complexes," Jpn. J. Appl. Phys., Volume 35, pp. L394–L396 (1996), which is incorporated herein by reference in its entirety; and phosphorescent materials, such as, for example, organometallic compounds containing heavy metal atoms that lead to strong spin-orbit coupling, such as those disclosed in Baldo et.al., "Highly efficient organic phosphorescent emission from organic electroluminescent devices," Letters to Nature, Volume 395, pp. 151–154 (1998), which is incorporated herein by reference in its entirety. Preferred examples include 2,3,7,8,12,13,17,18-octaethyl-21H23H-phorpine platinum(II)(PtOEP) and fac tris(2-phenylpyridine)iridium (Ir(ppy)3).

The luminescent region can also include one or more materials with hole-transporting properties. Examples of hole-transporting materials that can be utilized in the luminescent region include polypyrrole, polyaniline, poly (phenylene vinylene), polythiophene, polyarylamine as disclosed in U.S. Pat. No. 5,728,801, which is incorporated herein by reference in its entirety, and their derivatives, and known semiconductive organic materials; porphyrin derivatives such as 1,10,15,20-tetraphenyl-21H,23H-porphyrin copper (II) disclosed in U.S. Pat. No. 4,356,429, incorporated herein by reference in its entirety; copper phthalocyanine, copper tetramethyl phthalocyanine; zinc phthalocyanine; titanium oxide phthalocyanine; magnesium phthalocyanine; and the like.

A specific class of hole transporting materials that can be utilized in the luminescent region are the aromatic tertiary amines such as those disclosed in U.S. Pat. No. 4,539,507, which is incorporated herein by reference in its entirety. Suitable exemplary aromatic tertiary amines include, but are not limited to, bis(4-dimethylamino-2-methylphenyl) phenylmethane, N,N,N-tri(p-tolyl)amine, 1,1-bis(4-di-p-tolylaminophenyl)cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine, N,N'-di(naphthalene-1-yl)-N,N'-diphenyl-benzidine ("NPB"), mixtures thereof and the like. Another class of aromatic tertiary amines are polynuclear aromatic amines. Examples of these polynuclear aromatic amines include, but are not limited to, N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like; 4,4'-bis(9-carbazolyl)-1,1'-biphenyl compounds, such as, for example 4,4'-bis(9-carbazolyl)-1,1'-biphenyl and 4,4'-bis(3-methyl-9-carbazolyl)-1,1'-biphenyl, and the like.

A specific class of the hole transporting materials that can be used in the luminescent region are the indolo-carabazoles, such as those disclosed in U.S. Pat. Nos. 5,942,340 and 5,952,115, each incorporated herein by reference in its entirety, such as, for example, 5,11-di-naphthyl-5,11-dihydroindolo[3,2-b]carbazole, and 2,8-dimethyl-5,11-dinaphthyl-5,11-dihydroindolo[3,2-b]carbazole; N,N,N'N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N'N'-tetraarylbenzidine are N,N;-di-1-naphthyl-N,N'-diphenyl-1,1'-biphenyl-4,4'-diamine, which is more preferred; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like. Preferred hole transporting materials that can be used in the luminescent region are the naphtyl-substituted benzidine derivatives.

The luminescent region can also include one or more materials with electron transporting properties. An example of electron transporting materials that can be utilized in the luminescent region is polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers, as disclosed in incorporated Bernius et al., Proceedings of SPIE Conference on Organic Light Emitting Materials and Devices III, Denver, Colo., July 1999, Volume 3797, p. 129.

Other examples of electron transporting materials that can be utilized in the luminescent region can be selected from the metal oxinoid compounds, the oxadiazole metal chelate compounds, the triazine compounds and the stilbene compounds, examples of which have been described above in detail.

In embodiments where the luminescent region includes one or more hole transport material and/or one or more electron transport material in addition to the organic electroluminescent material(s), the organic electroluminescent material, the hole transport material(s), and/or the electron transport material(s) can be formed in separate layers, such as, for example, the OLEDs disclosed in U.S. Pat. Nos. 4,539,507; 4,720,432 and 4,769,292; or in the same layer thus forming mixed zones of two or more materials, such as, for example, the OLEDs disclosed in U.S. Pat. No. 6,130,001, and in U.S. application Ser. No. 09/357,551, filed on Jul. 20, 1999; Ser. No. 09/606,670, filed on Jun. 30, 2000; and Ser. No. 09/770,159, filed on Jan. 26, 2001. The disclosures of these patents and patent applications are incorporated herein by reference in their entirety.

The thickness of the luminescent region can vary from for example, about 1 nm to about 1000 nm, typically from about 20 nm to about 200 nm, and especially from about 50 nm to about 150 nm.

Figure 3:
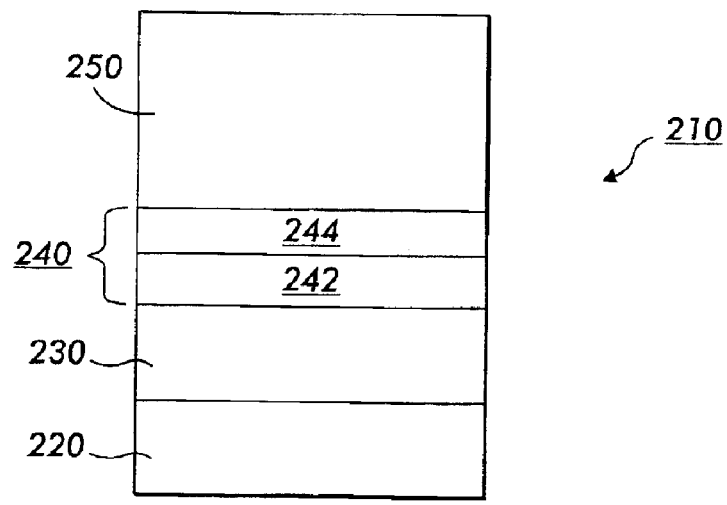
FIG. 3 illustrates an organic light emitting device similar to the organic light emitting device shown in FIG. 1 comprising a luminescent region including a hole transport zone and an electron transport zone.

FIG. 3 illustrates an organic light emitting device 210 similar to the organic light emitting device 10 shown in FIG. 1, in which the luminescent region 240 comprises a separate hole transport zone 242 and an electron transport zone 244. The hole transport zone 242 is formed over the anode 230, and the electron transport zone 244 is formed over the hole transport layer 242 and in contact with the cathode 250. The cathode 250 can comprise only a metal-organic mixed layer, or it can comprise a metal-organic mixed layer and one or more additional layers such as in the cathode 150 shown in FIG. 2.

The effectiveness of this invention on reducing the rate of growth of dark spots and in reducing the reflection of ambient light in organic light emitting devices has been demonstrated by comparing organic light emitting devices comprising cathodes according to this invention to organic light emitting devices comprising conventional cathodes.

Figure 4:
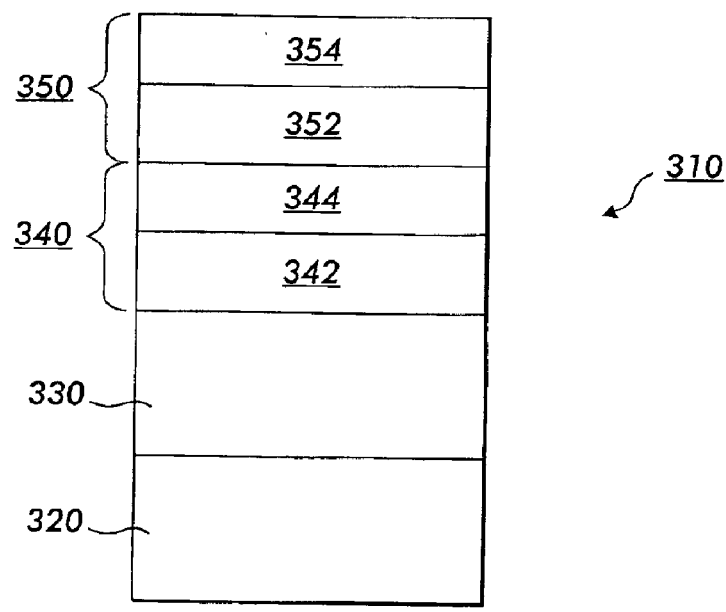
FIG. 4 illustrates an organic light emitting device comprising a conventional cathode structure.
Figure 5:
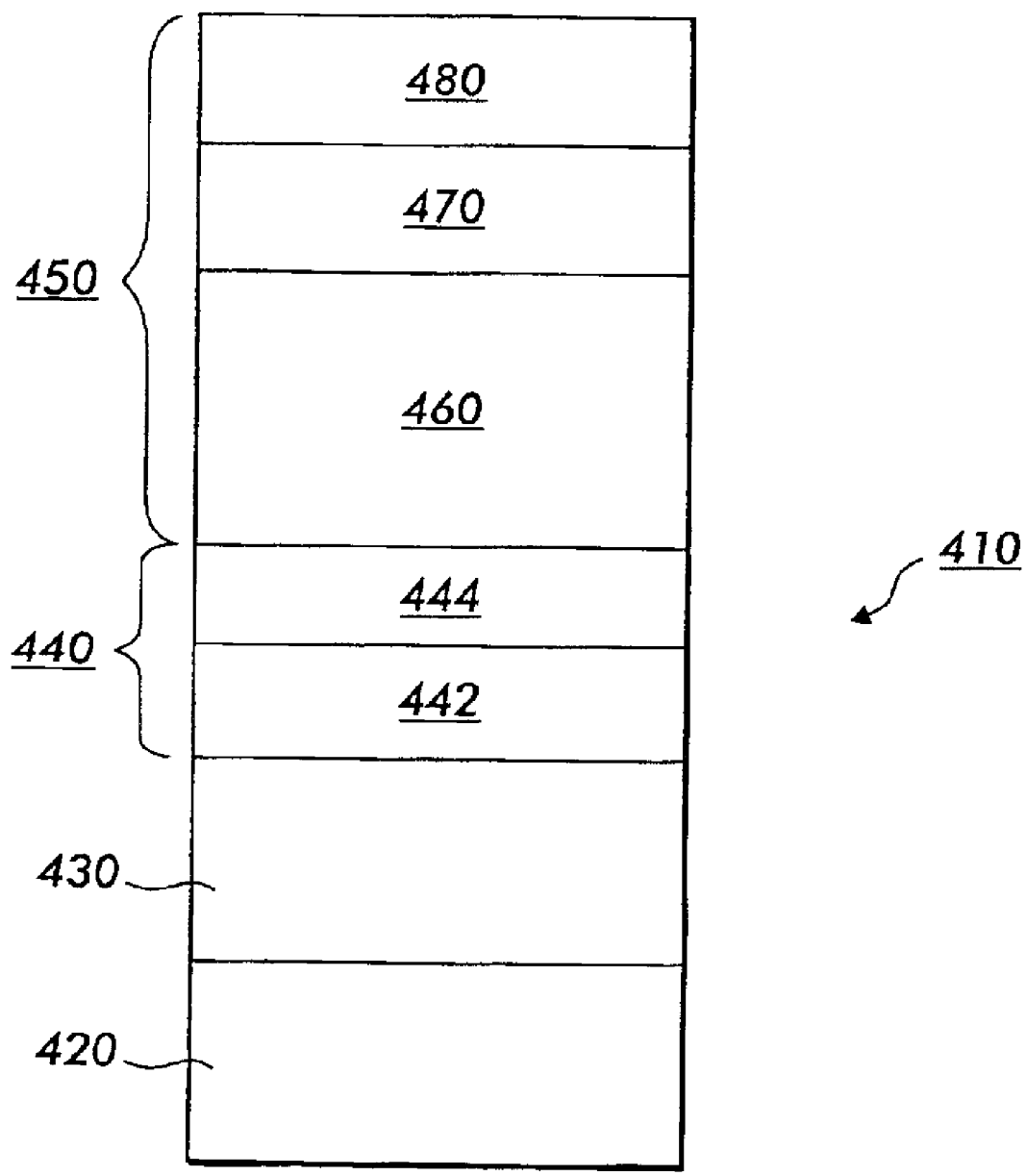
FIG. 5 illustrates an organic light emitting device comprising an embodiment of a cathode according to this invention.

FIGS. 4 and 5 illustrate the structures of organic light emitting devices 310, 410, respectively, that were tested and compared to each other. The organic light emitting device 310 shown in FIG. 4 includes a conventional cathode 350. The organic light emitting device 310 is formed on a substrate 320 and comprises an anode 330; an organic material region 340 including a hole transport zone 342 over the anode 330 and an electron transport zone 344 over the hole transport zone 342; and a cathode 350 including a first component region 352 and a second component region 354.

In the organic light emitting device 310 that was tested, the substrate 320 was formed of a transparent material; the anode 330 was formed of indium tin oxide having a thickness of 30 nm; the hole transport zone 342 was formed of NPB having a thickness of 60 nm; the emitting electron transport zone 344 was formed of AlQ3 having a thickness of 75 nm; the first component region 352 was formed of Mg:Ag 90 volume %, and 10 volume %, respectively, having a thickness of 120 nm; and the second component region was formed of Ag having a thickness of 90 nm.

The organic light emitting device 410 shown in FIG. 5 includes an exemplary embodiment of a cathode 450 according to this invention. The organic light emitting device 410 is formed on a substrate 420 and comprises an anode 430 on the substrate 420; an organic material region 440 including a hole transport zone 442 over the anode 430 and an electron transport zone 444 over the hole transport zone 442; and a cathode 450 including a metal-organic mixed layer 460, a first additional layer 470 over the metal-organic mixed layer 460 and a second additional layer 480 over the first additional layer 470.

In the organic light emitting device 410 that was tested, the substrate 420 was formed of a transparent material; the anode 430 was formed of indium tin oxide having a thickness of 30 nm; the hole transport zone 442 was formed of N,N'-di(naphthalene-1-yl)-N,N'-diphenyl-benzidine (NPB) having a thickness of 60 nm; the emitting electron transport zone 444 was formed of AlQ3 having a thickness of 75 nm; the metal-organic mixed layer was formed of AlQ3+Mg+Ag, in the ratio of 47.4 volume % AlQ3, 47.4 volume % Mg and 5.2 volume % Ag, and having a thickness of 150 nm; the first additional layer 470 was formed of Mg:Ag 90 volume %, and 10 volume %, respectively, having a thickness of 90 nm; and the second additional layer 480 was formed of Ag having a thickness of 90 nm.

When operated under an electric current of density equal to about 25 mA/cm$^2$, organic light emitting devices 310 and 410 produced bright green emission, at a luminance of about 670 and 450 cd/m$^2$, respectively, and the driving voltage was about 6.7 and 6.65 volts, respectively. The almost equal driving voltage for both devices shows that cathode 450 according to this invention in device 410 is efficient in electron injection and that its electron injection characteristics are comparable to that of conventional cathode 350 in device 310.

Figure 6A:
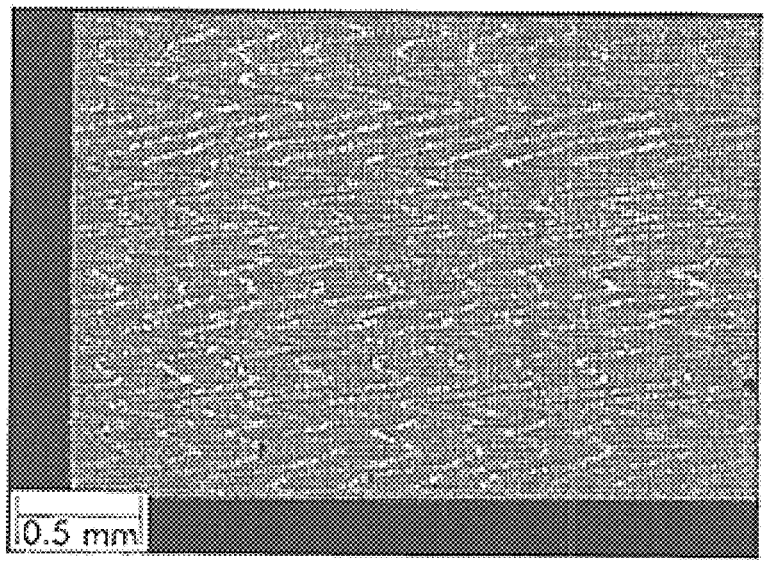
FIG. 6A shows a light emitting region of an organic light emitting device including a conventional cathode immediately after device fabrication.
Figure 6B:
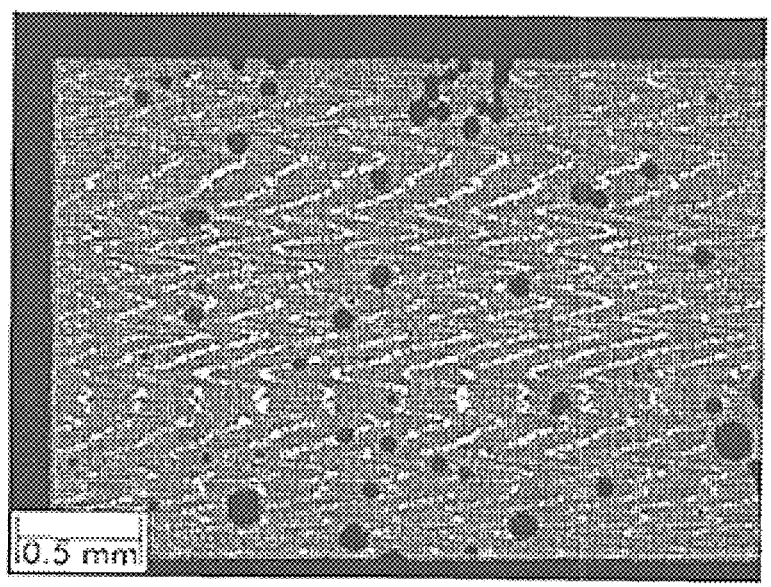
FIG. 6B shows the light emitting region of the organic light emitting device of FIG. 6A after the device has been stored for 48 hours under ambient conditions.
Figure 7A:
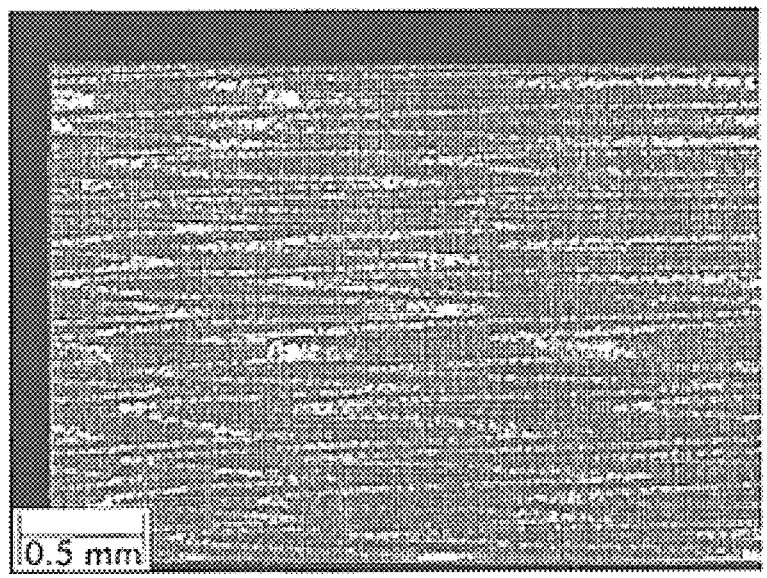
FIG. 7A shows a light emitting region of an organic light emitting device including a cathode according to this invention immediately after device fabrication.
Figure 7B:
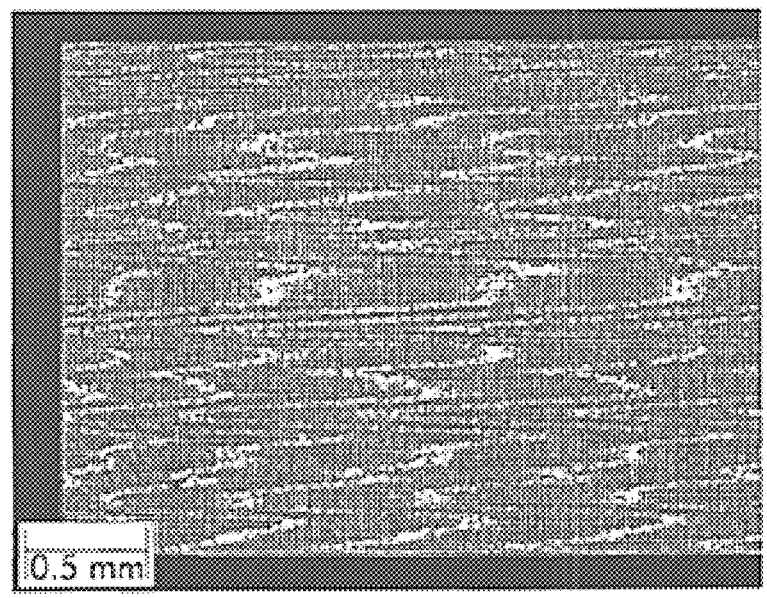
FIG. 7B shows the light emitting region of the organic light emitting device of FIG. 7A after the device has been stored for 48 hours under ambient conditions.

FIGS. 6A, 6B and 7A, 7B are micrographs showing dark spots in the emitting area of the organic light emitting device 310 including a conventional cathode 350 and the organic light emitting device 410 including a cathode 450 according to this invention, respectively. FIGS. 6A and 7A were obtained immediately after device fabrication. FIGS. 6B and 7B were obtained after storing the same organic light emitting devices for 48 hours under ambient conditions. FIGS. 6A–7B demonstrate that organic light emitting devices including cathodes according to this invention have a substantially reduced growth rate of the dark spots in comparison to conventional cathodes that do not include a metal-organic mixed layer.

In organic light emitting devices, the metal-organic mixed layer in embodiments can function as the electron injection contact or hole injection contact. Accordingly, suitable materials that can be used in additional layers of the cathodes or anodes according to this invention are not limited to metals having only certain charge injection properties. Therefore, this invention enables more stable materials to be used in forming additional layers of the cathodes. This effect has been demonstrated by forming and testing organic light emitting devices with cathodes comprising a metal-organic mixed layer formed of AlQ3+Mg+Ag and different materials in additional layers contacting the metal-organic mixed layer. The organic light emitting devices had a structure similar to that of the devices shown in FIG. 5 in which the Mg:Ag first additional layer 470 was replaced by an In or Ag layer. Each of these organic light emitting devices demonstrated approximately the same operating voltage, which is the voltage required to obtain a certain luminance or current density level, regardless of the particular material used in the additional cathode layer.

Other studies by the present inventors have shown that the operating voltage of organic light emitting device 410 is also independent of the thickness of the metal-organic mixed layer 460, which indicates that the voltage drop across the metal-organic mixed layer 460 is negligible. These results further demonstrate that the metal-organic mixed layer is highly conductive and acts as a highly-efficient electron injection contact in organic light emitting devices.

Figure 8:
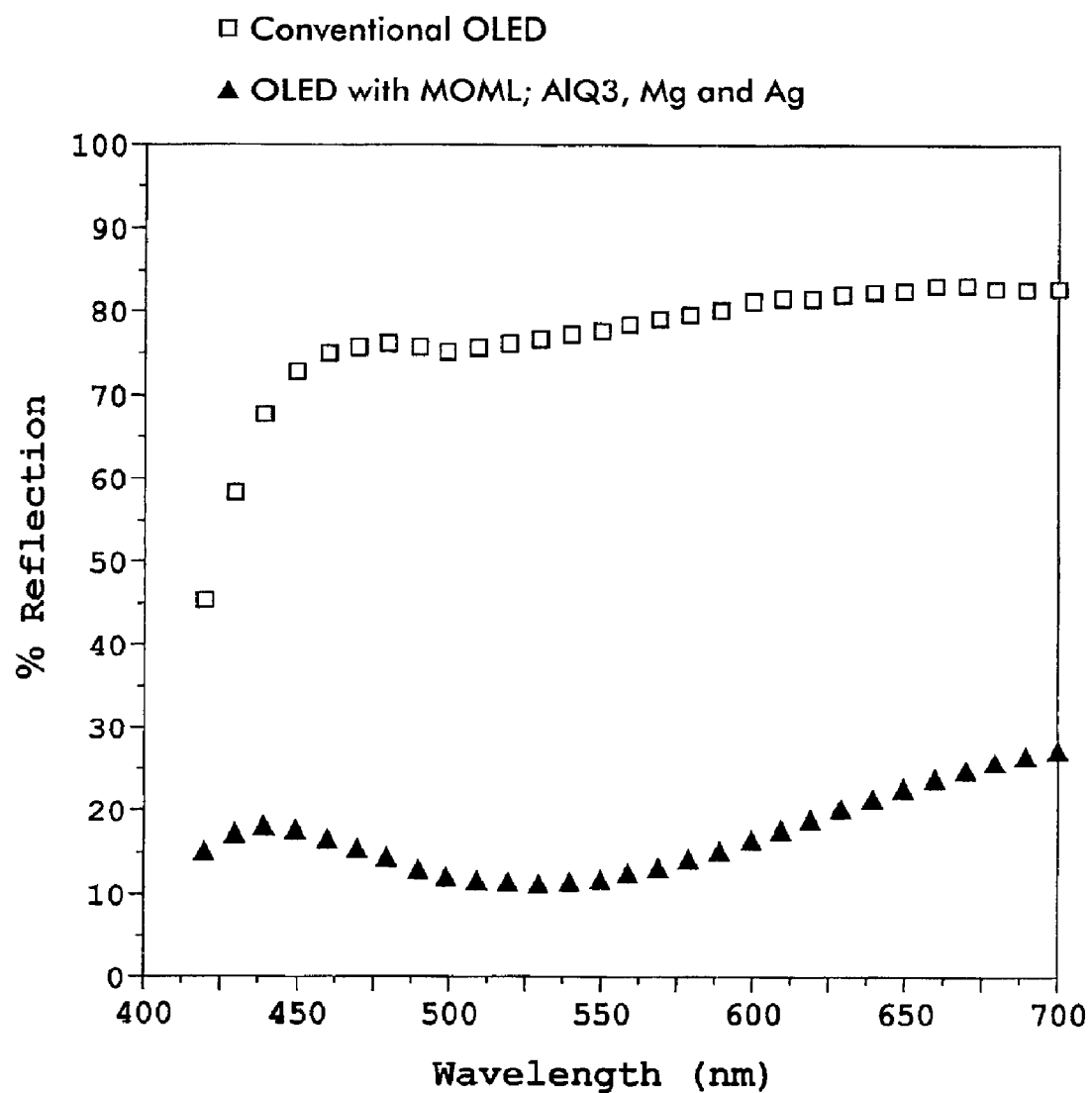
FIG. 8 shows a graph of % reflection versus wavelength for a conventional organic light emitting device and an organic light emitting device according to this invention.

In order to demonstrate the effect of the cathodes according to this invention in reducing the reflection of ambient light of organic light emitting devices in comparison to conventional cathodes, comparative measurements of the light reflection characteristics of device 410 (according to this invention), and of device 310 (conventional) were performed. The results, represented in the form of % reflection (i.e., the percentage of incident ambient light that is reflected back to the observer from the organic light emitting device) over the entire range of wavelengths of the visible light spectrum, are shown in FIG. 8. The results demonstrate significantly lower % reflection characteristics of device 410 in comparison to the % reflection characteristics of device 310. The lower % reflection achieves improved display contrast.

Figure 9:
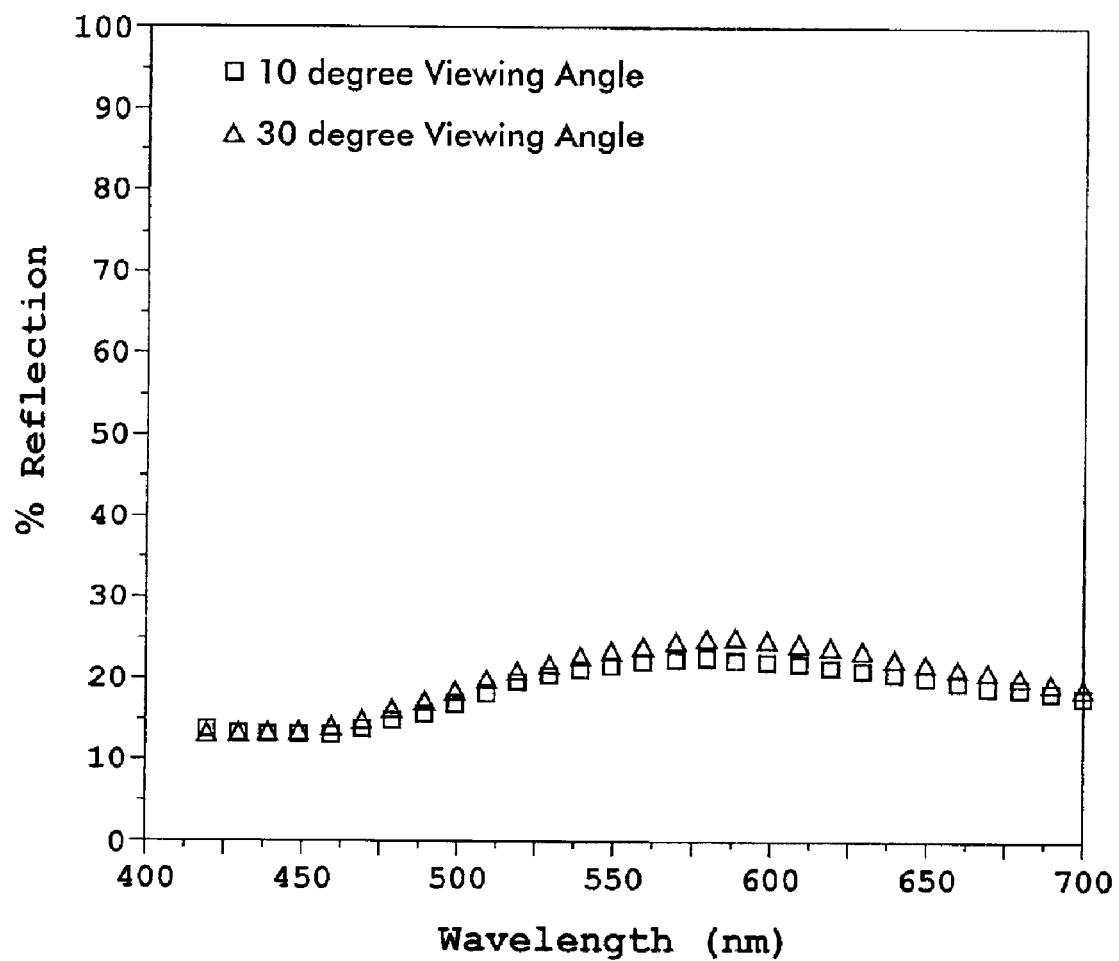
FIG. 9 shows a graph of % reflection versus wavelength for organic light emitting device according to this invention at different viewing angles.

In order to demonstrate that the improved contrast effect of cathodes according to this invention is independent of the viewing angle, and therefore does not suffer the disadvantages of other known methods for improving display contrast, such as, for example, embodiments disclosed in U.S. Pat. No. 5,049,780, which is incorporated herein by reference in its entirety, measurements of the light reflection characteristics of device 410 at different viewing angles were performed. The results, represented in the form of % reflection (i.e. the percentage of incident ambient light that is reflected back to the observer from the organic light emitting device) over the entire range of wavelengths of the visible light spectrum, for a viewing angle of about 10 degrees, and for a viewing angle of about 30 degrees, are shown in FIG. 9. The almost identical % reflection characteristics for both viewing angles shows that the reduced light reflection properties of device 410 (and hence the improved contrast), is independent of the viewing angle. The fact that the reflection characteristics are almost independent of the viewing angle indicates that the reduced light reflection in cathodes according to this invention is believed to be mainly attributed to light absorption in the metal-organic mixed layer. Other investigations by the inventors have shown that the metal organic mixed layer 460 is colored (i.e., not completely transmissive to light) also proving that the metal-organic mixed layer absorbs light.

Figure 10:
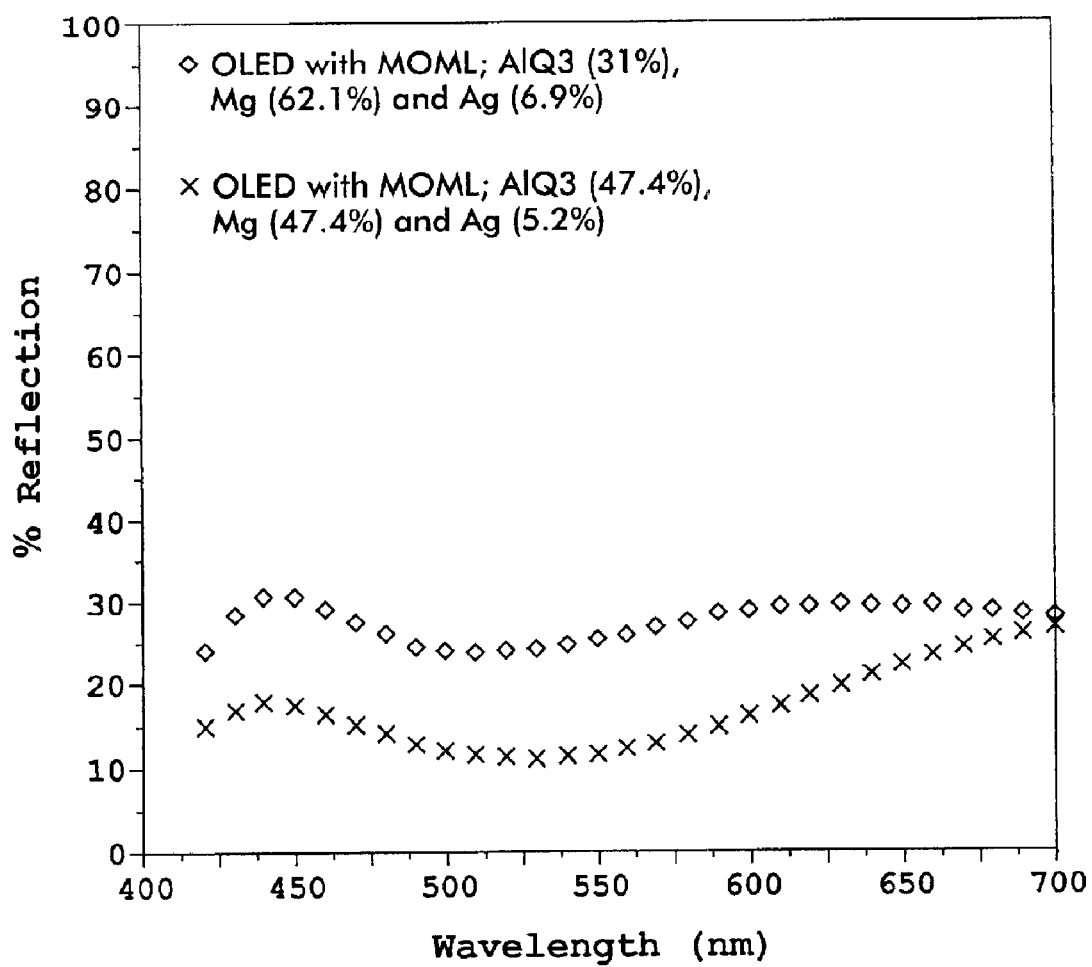
FIG. 10 shows a graph of % reflection versus wavelength for organic light emitting device according to this invention having different metal-organic mixed layer compositions.

In order to demonstrate that the reduced light reflection characteristics of cathodes according to this invention depend on the mixing ratio of the components comprising the metal-organic mixed layer, comparative measurements of the light reflection characteristics of device 410 in which the metal-organic mixed layer was formed of AlQ3+Mg+Ag, in the ratio of 47.4 volume % AlQ3, 47.4 volume % Mg and 5.2 volume % Ag, and of another device, which was in all respects identical to device 410, except that its metal-organic mixed layer was formed of AlQ3+Mg+Ag, in the ratio of 31.0 volume % AlQ3, 62.1 volume % Mg and 6.9 volume % Ag. The results, represented in the form of % reflection (i.e. the percentage of incident ambient light that is reflected back to the observer from the organic light emitting device) over the entire range of wavelengths of the visible light spectrum, are shown in FIG. 10. These results show significantly different % reflection characteristics for the two devices. The results show that there are preferred ranges for the mixing ratio of the components comprising the metal-organic mixed layer over which the improved contrast is achieved.

Figure 11:
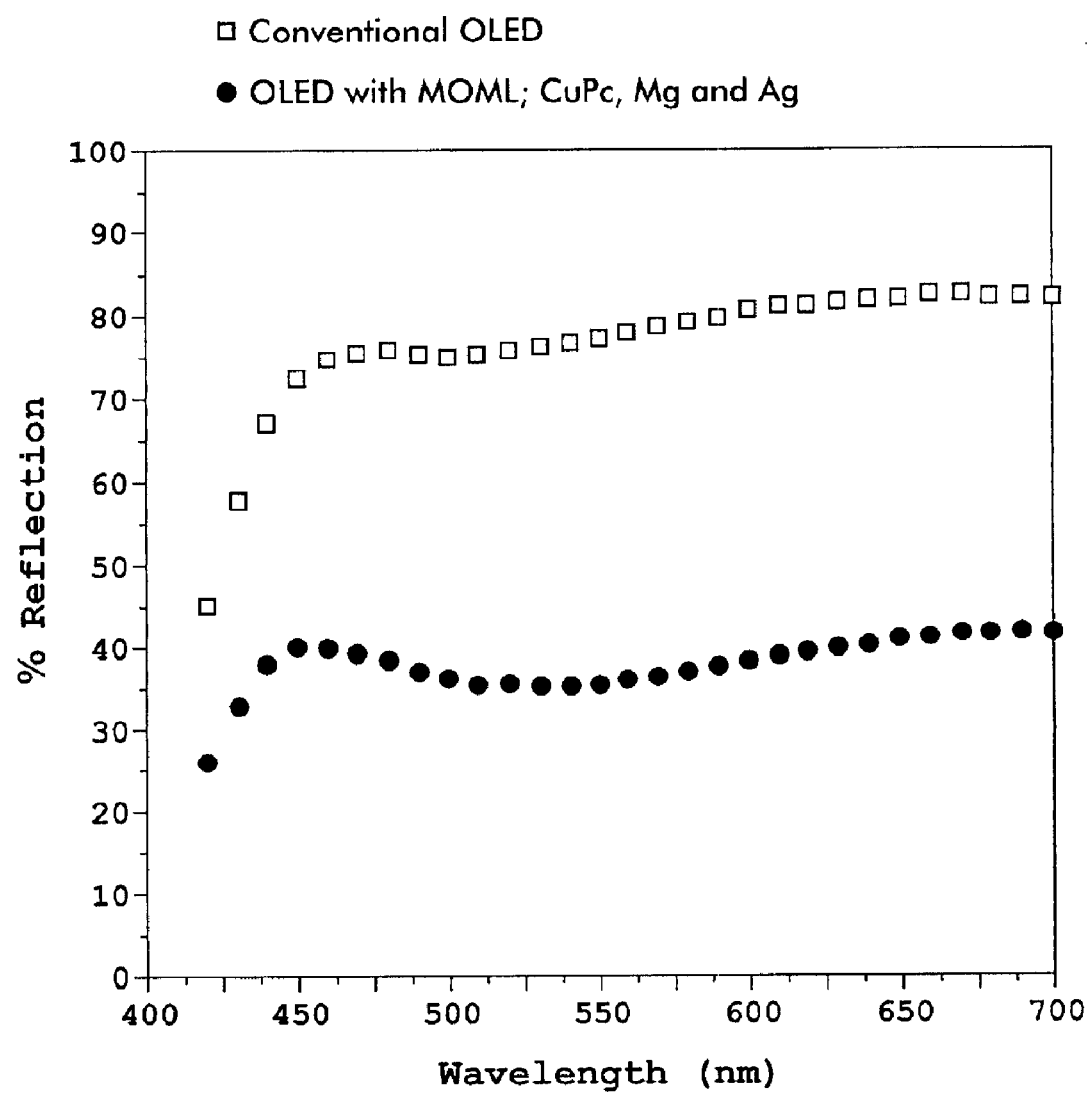
FIG. 11 shows a graph of % reflection versus wavelength for a conventional organic light emitting device and an organic light emitting device according to this invention.

In order to demonstrate that the reduced light reflection characteristics of cathodes according to this invention are not limited to cathodes containing a metal-organic mixed layer comprising AlQ3+Mg+Ag, an organic light device identical to device 410 described above except that the metal-organic mixed layer was formed of copper phthalocyanine (CuPc)+Mg+Ag, in the ratio of 31.0 volume % CuPc, 62.1 volume % Mg and 6.9 volume %, was formed. Comparative measurements of the light reflection characteristics of this device, and of device 310 (conventional) were performed. The results, represented in the form of % reflection (i.e., the percentage of incident ambient light that is reflected back to the observer from the organic light emitting device) over the entire range of wavelengths of the visible light spectrum, are shown in FIG. 11. The results demonstrate significantly lower % reflection characteristics of the device according to this invention, which comprised a metal-organic mixed layer formed of CuPc+Mg+Ag, in comparison to the % reflection characteristics of device 310. The lower % reflection results in improved display contrast. This example demonstrates that the reduced light reflection characteristics of cathodes according to this invention can be achieved with metal-organic mixed layers comprising a variety of components.

In metal-organic mixed layers of electrodes according to embodiments of the present invention, the optional third component may cause the formation of a layer having high conductivity, which is fundamentally different in nature (from a charge transport viewpoint) from certain two-component, metal-organic layers. The wide variety of embodiments available in the present invention permits the metal-organic mixed layer to have a thickness in a broad range of for example of about 50 nm to about 1000 nm, with improved display device contrast and reduced growth rates of dark spots.

Electroluminescent devices including the MOML according to this invention can be used in various types of image forming devices or display applications, such as, for example, flat panel displays. Such applications can be used in a wide range of products, such as, for example, displays for televisions and computers, instrument displays, displays for automotive and aviation applications, and hand-held electronic devices, such as, for example, cellular phones, etc.

The luminescent region for any inventive display device can include any suitable material such as those materials disclosed herein. For example, the luminescent region can include any one or a mixture of two or more of the following: molecular (small-molecule) electroluminescent materials, polymer electroluminescent materials, and inorganic electroluminescent materials. Examples of molecular (small-molecule) electroluminescent materials and polymer electroluminescent materials are disclosed herein. Inorganic electroluminescent materials include, for instance, phosphors, such as, ZnS, ZnSe, ZnTe, CdS, CdSe, CdTe, and the like, and which can further include dopants, such as, Cu, Nm and the lanthanides. Other examples of inorganic electroluminescent materials include GaAs, GaP, GaAsP, GaAlAs, InGa, SiC, GaN, AlInGaP, InGaN, InSe, and the like, and which can further include dopants, such as, Zn, O, N, Si and the like.

To avoid confusion in understanding the scope of the present invention, the following guidelines can be used:
(1) The term "layer" indicates a single coating generally having a composition that differs from the composition of an adjacent layer;
(2) The term "region" refers to a single layer, a plurality of layers such as two, three or more layers, and/or one or more "zones";
(3) The term "zone," as used in the context of the charge transport zone (i.e., hole transport zone and electron transport zone) and the light emitting zone, refers to a single layer, a plurality of layers, a single functional area in a layer, or a plurality of functional areas in a layer;
(4) Generally, all regions and layers of the display device that are between the two electrodes or that participate in the charge conduction processes needed to operate the display device are considered part of either the cathode, luminescent region, or anode;
(5) Generally, a layer (e.g., substrate) that does not participate in the charge conduction processes of the display device and that can be viewed as being outside of the two electrodes shall not be considered part of the electrodes; such a layer (e.g., substrate), however, still may be considered a part of the display device;
(6) A capping region (which protect an electrode from the ambient environment), however, is considered part of the electrode regardless whether the capping region participates in the charge conduction processes of the display device;
(7) Any region or layer (e.g., electron injection region and hole injection region) that injects charge into the luminescent region is considered part of the electrode;
(8) If the MOML can be equally viewed as part of the electrode or the luminescent region, the convention is that the MOML is part of the electrode;
(9) Impurities (which may be present in small amounts in the two, three, four, or more material components making up the MOML) are generally not considered a designated component of the MOML; for example, the presence of impurities in a "Binary MOML" composed of the two designated components of the inorganic metal containing material and the organic compound would not change the designation of the MOML as being a "Binary MOML"; and
(10) "Light emitting region" and "luminescent region" are used interchangeably.

In embodiments of the present invention, the MOML can be located anywhere in the display device. For example, the MOML can be part of the cathode, anode, or luminescent region. In embodiments, the MOML can be located in a region of the display device that is not considered part of either the electrodes or the luminescent region. It is also possible to have a plurality of MOMLs in the display device. In this case, the two or more MOMLs can be contacting each other, or can be separated by one or more layers.

As discussed herein, the MOML can be a "Binary MOML" (with two components), a "Ternary MOML" (with three components), "Quaternary MOML" (with four components), or other MOMLs with more than four components. In these embodiments, the selection of the inorganic metal containing material, the organic compound and any other additional components is made on the basis that the MOML should have the desired property or properties. In addition to being light reflection-reducing, the MOML can optionally possess one or more additional desired properties including for example being electrically conductive and any other properties that the MOML may need to have in order to serve other functions as may be required by the location of the MOML in the display device (such as the need to also be capable of injecting charge efficiently if the MOML is the part of an electrode that is adjacent the luminescent region). In cases when the display device includes a plurality of MOMLs, the MOMLs can be of the same or different material composition.

There now follows a discussion of exemplary materials and configurations of the present display device. For convenience, a substrate is not depicted in FIGS. 12–17; it is understood however that a substrate may be positioned at any suitable place in the depicted display devices such as in contact with either electrode.

In embodiments, the MOML may be used in one, two, or more layers or regions of the display device. Where used in two or more layers or regions, the MOMLs may be the same or different from each other. Each MOML may be a "Binary MOML," "Ternary MOML," "Quaternary MOML," or a MOML having more than four components, with the MOMLs having a composition as described herein. Unless otherwise noted, materials described as being suitable for a component category of one MOML type are generally suitable for the same component category of other MOML types (where the MOML types are Binary, Ternary, Quaternary and higher) where the component categories are for example "inorganic metal containing material," "organic material," "metals," "inorganic materials," and the like.

It is noted that the lists of suitable materials for the components in a particular MOML type may overlap. For example, in a "Ternary MOML," suitable materials for the second component (i.e, an organic material) are the same as the choice of "organic materials" for the third component. In addition, in a "Ternary MOML," suitable materials for the first component (i.e., an inorganic metal containing material) overlap with the choice of "metals" and "inorganic materials" for the third component. However, no inconsistency is present even if the lists of suitable materials for the components in a particular MOML type overlap as long as the selected components of the MOML type are different from one another, i.e., each selected component is unique.

Illustrative numerical values and illustrative materials are described herein. The present invention, however, also encompasses numerical values, ranges (and sub-ranges) of numerical values, materials, and groups (and sub-groups) of materials not specifically recited herein. For instance, a disclosure of a numerical range of 1–10 encompasses every number within that range as well as sub-ranges such as 1–3, 2–5, and the like.

Binary MOML

The phrase "Binary MOML" refers to a metal-organic mixed layer composed of two components: (i) an inorganic metal containing material, and (ii) an organic material. Exemplary embodiments of such Binary MOML can include:

1. MOML composed of Ag or an inorganic compound thereof (e.g., an oxide, hydroxide, halide, sulfide, nitride, carbide, boride, and the like) and an organic compound.
2. MOML composed of a Group 11 metal (such as Cu, Ag or Au) or an inorganic compound thereof (e.g., an oxide, hydroxide, halide, sulfide, nitride, carbide, boride, and the like) and an organic compound.
3. MOML composed of a Group 10 metal (such as Ni, Pd or Pt) or an inorganic compound thereof (e.g., an oxide, hydroxide, halide, sulfide, nitride, carbide, boride, and the like) and an organic compound.
4. MOML composed of a Group 13 metal (such as In) or an inorganic compound thereof (e.g., an oxide, hydroxide, halide, sulfide, nitride, carbide, boride, and the like) and an organic compound.
5. MOML composed of a Group 4 metal (such as Ti) or an inorganic compound thereof (e.g., an oxide, hydroxide, halide, sulfide, nitride, carbide, boride, and the like) and an organic compound.
6. MOML composed of a metal or an inorganic compound thereof (e.g., an oxide, hydroxide, halide, sulfide, nitride, carbide, boride, and the like) and an organic compound with significant optical absorption in the 400–700 nm wavelength range of the spectrum (e.g., an organic dye compound).
7. MOML composed of a Group 16 metal (i.e., Se and Te) or an inorganic compound thereof (e.g., an oxide, hydroxide, halide, sulfide, nitride, carbide, boride, and the like) and an organic compound.

Ternary MOML

The phrase "Ternary MOML" refers to a metal-organic mixed layer composed of three components: (i) an inorganic metal containing material, (ii) an organic compound, and (iii) an additional third component (different from the other two components), which can be a metal, an organic material or an inorganic material. Exemplary embodiments of the Ternary MOML include:
1. MOML of Binary MOML embodiments above and further including a Group 1 metal (also sometimes called an alkali metal) such as Li, Na, K, Rb or Cs or a compound thereof such as a Group 1 metal halide (e.g., fluoride, chloride, bromide, iodide), oxide, hydroxide, nitride or sulfide.
2. MOML of Binary MOML embodiments above and further comprising a Group 2 metal (also sometimes called alkaline earth metal) such as Be, Mg, Ca, Sr or Ba or a compound thereof such as a Group 2 metal halide (e.g. fluoride, chloride, bromide iodide), oxide, hydroxide, nitride, boride, or sulfide.
3. MOML composed of at least an inorganic metal containing material, an organic compound, and Ag or an Ag compound (e.g., a silver oxide, hydroxide, halide, sulfide, nitride, carbide, boride, and the like).
4. MOML composed of (i) an inorganic metal containing material, (ii) organic compound, and (iii) Zn, In or Sn or compounds thereof (e.g., ZnO, ZnS, $In_2O_3$, $SnO_2$).
5. MOML composed of at least an organic compound and INCONEL™ (an alloy composed of a plurality of metals).
6. MOML composed of at least Al or an inorganic compound thereof (e.g., an oxide, hydroxide, halide, sulfide, nitride, carbide, boride, and the like), an organic compound, and any third component which can be another metal (e.g., Ag, a Group 1 metal, or Group 2 metal) or compounds thereof.
7. MOML composed of (i) porphyrin, tertiary aromatic amine, indolocarbazole, polythiophene, PEDOT™ (which is a specific polythiophene) (ii) Ag or a compound thereof, and (iii) Au, Cr, Cu, Pt, In, Ni, Sn, or compounds thereof such as $In_2O_3$, $SnO_2$.

Quaternary MOML

The phrase "Quaternary MOML" refers to a metal-organic mixed layer composed of four components: (i) an inorganic metal containing material, (ii) an organic material, (iii) an additional third component, and (iv) an additional fourth component. The additional third and fourth components (which are different from each other and from the first and second components) can be metals, organic materials, or inorganic materials. Exemplary embodiments of Quaternary MOML include:
1. MOML composed of an organic compound, Ag, Mg, and a Group 1 metal (e.g., Li) or a compound thereof (e.g., LiF).
2. MOML composed of an organic compound, Ag, Ca, and a Group 1 metal (e.g., Li) or a compound thereof (e.g., LiF).
3. MOML composed of an organic compound, Ag, Ca, and another Group 2 metal (e.g., Mg) or a compound thereof (e.g., $MgF_2$ or MgO).
4. MOML composed of an organic compound, Ag, Al, and a Group 1 metal (e.g., Li) or a compound thereof (e.g., LiF), or a Group 2 metal (e.g., Ca or Mg) or a compound thereof.

MOML as Part of Electrode

Figure 12:
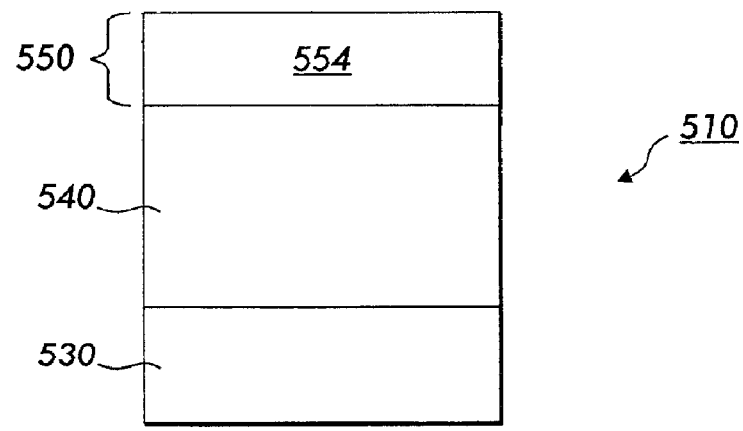
FIG. 12 illustrates an embodiment of the present display device where a single layer electrode incorporates the MOML.
Figure 13:
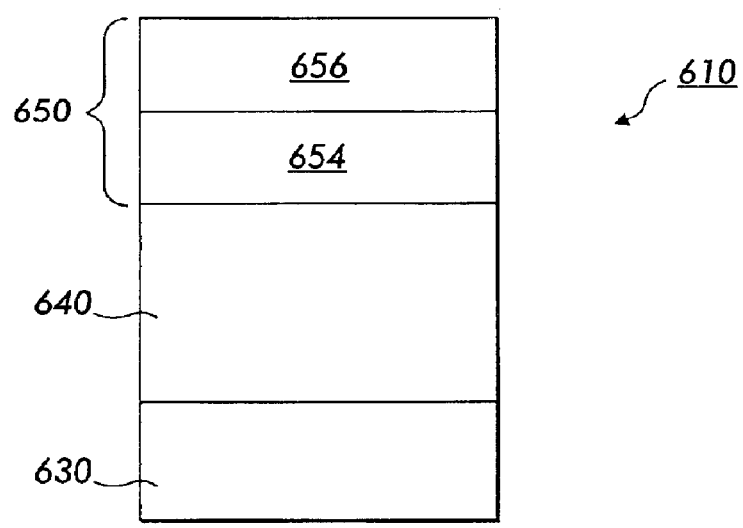
FIG. 13 illustrates an embodiment of the present display device where an electrode includes the MOML and a capping region.
Figure 14:
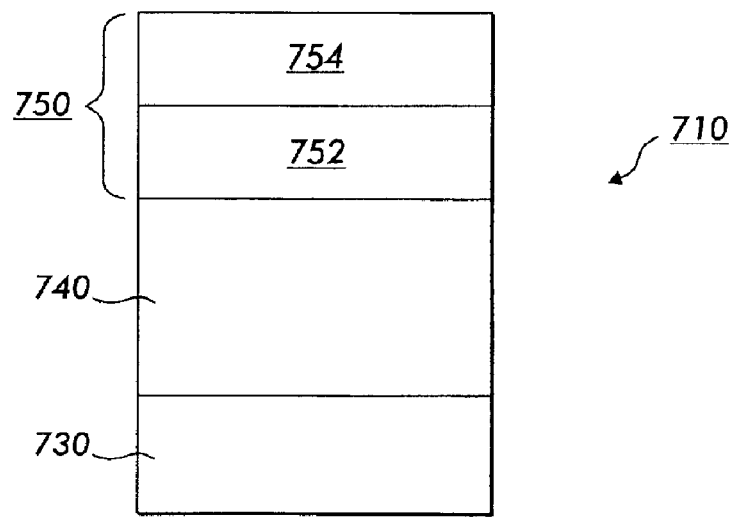
FIG. 14 illustrates an embodiment of the present display device where an electrode includes a charge injection region and the MOML.

FIGS. 12–15 illustrate display devices (510, 610, 710, 810) composed of first electrode (550, 650, 750, 850), luminescent region (540, 640, 740, 840), and second electrode (530, 630, 730, 830), where the first electrode incorporates the MOML (554, 654, 754, 854). In FIG. 12, the first electrode is a single layer composed entirely of the MOML. The first electrode can be composed of multiple layers:

FIG. 13—capping region 656/MOML 654;
FIG. 14—MOML 754/charge injection region 752; and
FIG. 15—capping region 856/MOML 854/charge injection region 852.

Embodiments of the present invention will now be discussed where the cathode includes the MOML. In a single-layered cathode, the cathode can be entirely formed of the MOML. In a multi-layered cathode, one or more or even all of the layers can be composed of the MOML. In cases when the MOML is contacting the luminescent region, the MOML, in addition to being electrically-conductive and light reflection-reducing, also may be capable of efficiently injecting electrons into the luminescent region. In these cases, electron injection properties of the MOML can be enhanced by, for example, including a low work function metal (typically <4.0 eV) or a compound thereof in the MOML. Exemplary embodiments for cathodes incorporating the MOML include embodiments depicted in FIGS. 12–15 where the first electrode is the cathode, the second electrode is the anode, and the charge injection region is an electron injection region.

Where the MOML contacts the luminescent region (e.g., where the MOML is a single layer cathode or where the cathode is multi-layered and the MOML is the layer adjacent to the luminescent layer), the MOML can be, for example, selected from a Binary, Ternary or Quaternary MOML given that it provides efficient electron injection into the luminescent region. Where the MOML is a cathode layer that contacts the luminescent region, the MOML may be composed of a metal with work function <4.0 eV or a compound thereof, examples of these MOMLs being: (i) Organic compound+Mg+Ag, (ii) Organic compound+Mg+Ag+a Group 1 metal or compound thereof, (iii) Organic compound+Ag+Al+a Group 1 metal or compound thereof, (iv) Organic compound+Mg+Ag+Ca, (v) Organic compound+Ca+Ag, (vi) Organic compound +Ca+Ag+a Group1 metal or a compound thereof, and (vii) Organic compound+Ag+a Group 1 metal or a compound thereof.

Figure 15:
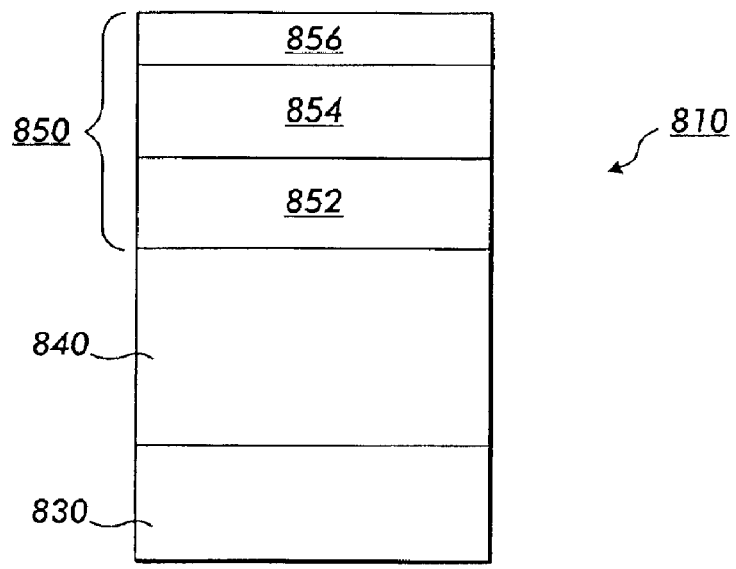
FIG. 15 illustrates an embodiment of the present display device where an electrode includes a charge injection region, the MOML, and a capping region.

To protect the MOML from ambient conditions, or when the conductivity of the MOML is not sufficient to sustain high lateral conduction (to sustain high lateral conduction, the sheet resistance of the MOML may be for instance less than about 1,000 Ohms/square, and particularly less than about 100 Ohms/square), the cathode optionally further includes a capping region as seen for example in FIGS. 13 and 15. A capping region can be composed of metals (e.g., Al, Mg, Mg:Ag, Ag, Ca, In, Ti, Ni) or inorganic materials (e.g., C, SiO, $SiO_2$, SiN, and metal compounds such as $Al_2O_3$, $In_2O_3$, $SnO_2$, ITO, LiF, $MgF_2$). A capping region can comprise another MOML. Our studies show, for instance, that while a cathode composed of a MOML made of an organic compound+Ag+a Group 1 metal or compound thereof and a capping region made of Ag may in certain embodiments exhibit a poor stability, the use of a second MOML (composed of an organic compound+Mg+Ag) as another capping region in between the first MOML and the Ag capping region enhances the stability. Therefore, in some embodiments, it is desirable to use two or more layers in the capping region that are, themselves, MOML of another composition. Poor stability refers to for instance a rapid growth of dark spots such that they grow big enough to cover about 10% or more of the emitting area of the OLED within 24 hours of its fabrication if left in air.

In embodiments when it might be desirable to further facilitate electron injection from the MOML into the luminescent region or to alleviate the electron injection requirements of the MOML, a separate electron injection region can be further included in the cathode. A cathode incorporating a separate electron injection region is schematically shown in FIGS. 14–15 where the charge injection region is an electron injection region. An electron injection region can be one or two thin layer(s) composed of a low work function metal (<4.0 eV) (e.g., a Group 1 or a Group 2 metal), and alloys and compounds of low work metals (e.g., Al:Li, Ca:Al, Mg:Ag, Al:LiF, Al:$Li_2$O). In a double-layered electron injection region, the layer contacting the luminescent region is typically comprised of a Group 1 or Group 2 metal, or an alloy or a compound thereof, and the layer contacting the MOML is typically composed of any metal or a metal alloy. The thickness of any metal layers in the electron injection region may be small (typically, each layer <25 nm) in order to allow a substantial portion of the incident light (for instance, at least 30%) to be transmitted to the MOML, and to avoid significant light reflection. The electron injection region can itself be another MOML with more efficient electron injection characteristics than the first MOML. For example, the MOML can be composed of an organic compound+Ag (or Au or Cu or Ti or Ni) and the electron injection region can be (i) a layer of LiF, (ii) a layer of Ca, (iii) a layer of Mg:Ag alloy, (iv) a layer of Al:Li alloy, (v) a layer of Al:LiF mixture, (vi) a second MOML layer composed of an organic compound+Ag+a Group 1 metal or a Group 2 metal, (vii) a second MOML layer composed of an organic compound+Ag+a Group 1 metal compound or a Group 2 metal compound, or (viii) a layer of a Group 1 metal compound and a layer of Al or any other metal.

Embodiments of the present invention will now be discussed where the anode includes the MOML. In a single-layered anode, the anode can be entirely formed of the MOML. In a multi-layered anode, one or more or even all of the layers can be composed of the MOML. In cases when the MOML is contacting the luminescent region, the MOML, in addition to being electrically-conductive and light reflection-reducing, also may be capable of efficiently injecting holes into the luminescent region. In these cases, hole injection properties of the MOML can be enhanced by, for example, including a high work function metal (typically >4.0 eV) or a compound thereof in the MOML. Exemplary embodiments for anodes incorporating the MOML include embodiments depicted in FIGS. 12–15 where the first electrode is the anode, the second electrode is the cathode, and the charge injection region is a hole injection region.

Where the MOML contacts the luminescent region (e.g., where the MOML is a single layer anode or where the anode is multi-layered and the MOML is the layer adjacent to the luminescent layer), the MOML can be, for example, selected from a Binary, Ternary or Quaternary MOML given that it provides efficient hole injection into the luminescent region. Where the MOML is an anode layer that contacts the luminescent region, the MOML may be composed of a metal or a semiconductor with work function >4.0 eV, examples of these MOMLs being: (i) Organic compound (e.g. a porphyrin or a tertiary aromatic amine or an indolocarbazole, or a polythiophene)+a Group 10 metal or a Group 11 metal (e.g. Ag or Au or Cu, or Pt or Pd or Ni), (ii) Organic compound+ Ag (or Au)+a high work function (>4 eV) metal or metal compound, and (iii) Organic compound+a Group 10 metal or a Group 11 metal+Cr or ITO or $In_2O_3$ or $SnO_2$.

To protect the MOML from ambient conditions, or when the conductivity of the MOML is not sufficient to sustain high lateral conduction (to sustain high lateral conduction, the sheet resistance of the MOML may be less than about 1,000 Ohms/square, and particularly less than about 100 Ohms/square), the anode optionally includes a capping region as seen for example in FIGS. 13 and 15. A capping region can be composed of metals (e.g., Al, Ag, In, Sn, Se, Ti, Ni, Pt, Au, Cr, Cu, INCONEL™, Au:Pd) or inorganic materials (e.g., C, Si, Ge, SiO, $SiO_2$, SiN, and metal compounds such as $Al_2O_3$, $In_2O_3$, $SnO_2$, ITO, ZnO). As with cathodes, a capping region for the anode can also be composed of MOMLs.

In cases when it might be desirable to further facilitate hole injection from the MOML into the luminescent region or to alleviate the hole injection requirements of the MOML, a separate hole injection region can be further included in the anode. An anode incorporating a hole injection region is schematically shown in FIGS. 14–15 where the charge injection region is a hole injection region. A hole injection region can comprise one or two thin layer(s) composed of a metal, a metal compound, or a semiconductor with work function >4.0 eV (e.g., Au, Ni, Pt, Ag, Cr, Pd, Au:Pd, Cu, ITO, $In_2O_3$, $SnO_2$, ZnO) or an organic compound with an ionization potential >4.0 eV (e.g., CuPc). In a double-layered hole injection region, the layer contacting the luminescent region is typically composed of a semiconductor with work function >4.0 eV (e.g., ITO) or an organic compound with ionization potential >4.0 eV (e.g., CuPc), or a metal, a metal alloy or a metal compound all having a work function >4.0 eV; and the layer contacting the MOML is typically composed of any metal or a metal alloy. The thickness of any metal layers in the hole injection region may be small (typically, each layer <25 nm) in order to allow a substantial portion of the incident light (for instance, at least 30%) to be transmitted to the MOML, and to avoid significant light reflection. As in the case of cathodes, the hole injection region can itself be another MOML with more hole injection characteristics than the first MOML.

MOML in the Luminescent Region

The MOML can be part of the luminescent region such as located anywhere inside the luminescent region. For example, it can be located inside (and hence can be viewed as being part of) the electron transport zone or the hole transport zone (where the electron transport zone and the hole transport zone correspond to functional areas of the same layer or to two, three or more layers that comprise the luminescent region). The MOML can also be located in-between the electron transport zone and the light emitting zone, or in-between the hole transport zone and the light emitting zone.

Figure 16:
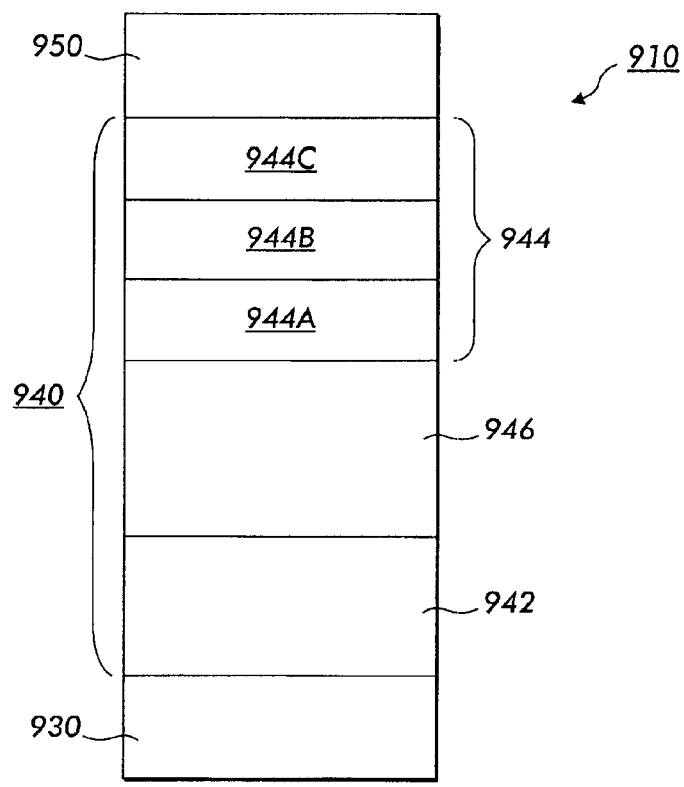
FIG. 16 illustrates an embodiment of the present display device where the luminescent region includes the MOML.

FIG. 16 depicts an illustrative display device 910 composed of a first electrode 950, a luminescent region 940, and a second electrode 930. The luminescent region 940 includes a light emitting zone 946 between a first charge transport zone 944 and a second charge transport zone 942. The first charge transport zone 944 includes an electrode closest layer 944C, a middle layer 944B, and an emitting zone closest layer 944A. One or more of the electrode closest layer, the middle layer, and the emitting zone closest layer may contain a MOML (where two or more MOMLs are employed, they may be the same or different from each other). In embodiments, the middle layer is the MOML. The first electrode can be either the cathode or anode and the second electrode can be either the cathode or anode. In addition, the first charge transport zone can be either a hole transport zone (with the second charge transport zone being an electron transport zone) or an electron transport zone (with the second charge transport zone being a hole transport zone).

An example of an OLED configuration including a MOML located inside the electron transport zone is the following ("ETM" refers to electron transport material; "HTM" refers to hole transport material):

(1) Anode/(2) Hole transport zone composed of a HTM/(3) Light emitting zone composed of a mixture of HTM+ETM/(4) Electron transport zone composed of ETM1/MOML composed of ETM2+inorganic metal containing material/ETM3/(5) Cathode; and where ETM, ETM1, ETM2 and ETM3 can be the same or different electron transport materials. For instance, ETM, ETM1, ETM2 and ETM3 can all be a triazine (e.g., T1 which is 4,4'-bis[2-(4,6-diphenyl-1,3,5-triazinyl)]-1,1'-biphenyl) or a metal chelate (e.g., AlQ3), and the inorganic metal containing material is for example Ag or a compound thereof.

An example of an OLED configuration including a MOML located inside the hole transport zone is the following:

(1) Anode/(2) Hole transport zone composed of HTM1/MOML composed of HTM2+inorganic metal containing material/HTM3/(3) Light emitting zone composed of a mixture of HTM+ETM/(4) Electron transport zone comprising ETM/(5) Cathode; and where HTM, HTM1, HTM2 and HTM3 can be the same or different hole transport materials. For instance, HTM, HTM1, HTM2 and HTM3 can all be a tertiary aromatic amine (e.g., NPB which is N,N'-di(naphthalene-1-yl)-N,N'-diphenyl-benzidine), and the inorganic metal containing material is for example Ag or a compound thereof. Alternatively, for instance, either one or both of HTM1 and HTM3 can be a porphyrin (e.g., CuPc).

Multiple MOMLs

The display device in embodiments can include two or more MOMLs, in which case, some or all of the MOMLs can be adjacent to (i.e., contacting) each other and some or all of the MOMLs can be separated by other layers. Examples of adjacent multiple MOMLs had already been described herein. A display device containing non-adjacent MOMLs can, for example, be a case when both the anode and the cathode each includes one or more MOMLs. Clearly, other embodiments are also possible.

The reduced reflection effect of the present display devices may be due to one, two, or more of the following optical effects: light absorption, destructive optical interference phenomena, and various light scattering and diffusing phenomena. So although the reduced reflection effect of the present display devices is believed to be primarily attributed to the light absorbing nature of the MOML (as evident, for example, from the fact that individual MOML films are dark-colored), other optical effects, such as destructive optical interference phenomena, or various light scattering and diffusing phenomena, also may be playing a role in achieving the reduced light reflection effect. In embodiments of the present invention, one or more additional layers could be incorporated into the display device to enhance the destructive optical interference phenomenon.

MOML Outside of Electrodes and Luminescent Region

Figure 17:
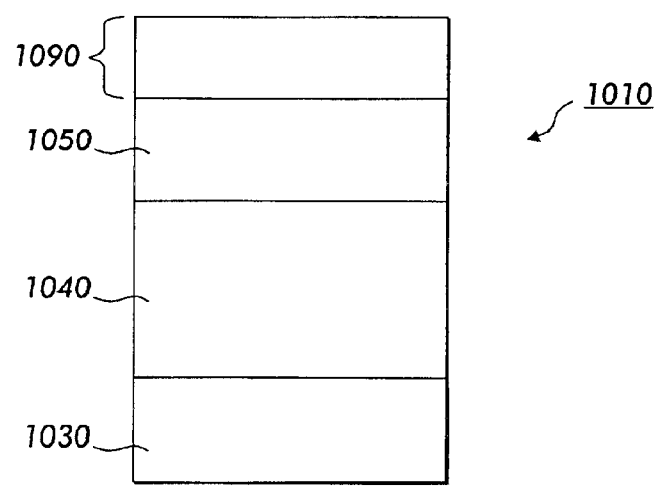
FIG. 17 illustrates an embodiment of the present display device where the MOML is located in a region that is not considered part of the adjacent electrode.

FIG. 17 depicts an embodiment of the display device 1010 composed of: in sequence: MOML containing region 1090, first electrode 1050, luminescent region 1040, and second electrode 1030. The MOML containing region does not participate in the charge conduction processes of the display device and thus is not considered part of the first electrode. For the MOML containing region to be considered external to the first electrode, the first electrode may for example contain an electrically non-conductive layer or region (e.g., non-conductive capping region) adjacent to the MOML containing region; or the MOML containing region can include a non-conductive layer adjacent to the first electrode; or both the MOML containing region and the first electrode each includes an adjacent non-conductive layer. Since the MOML containing region is not considered part of the first electrode (from a charge conduction viewpoint), the MOML can be either electrically conductive or non-conductive.

The MOML containing region may be composed of one, two, three, or more layers, any, some, or all of which can be MOML(s). In embodiments, the MOML containing region includes pairs of layers such as one pair, two pairs, and the like. In each pair, the layer closer to the first electrode may be the MOML and the other layer may be substantially transparent. The substantially transparent layer can be for example like those disclosed in U.S. Pat. No. 5,049,780 (layer composition of $ZrO_2$, $Al_2O_3$, ZnS, ITO, $TiO_2$, $SiO_2$ or the like), the disclosure of which is totally incorporated herein by reference; the substantially transparent layer can also be electrically conductive such as those disclosed in WO 01/08240 A1 (layer composition of ITO, ZnO or the like), the disclosure of which is totally incorporated herein by reference.

An example of a display device having an external MOML containing region is the following: (1) transparent anode; (2) luminescent region; (3) transparent or substantially transparent cathode (comprising [A] an electron injection region (<25 nm) composed of, for instance, (i) a layer of LiF, (ii) a layer of Ca, (iii) a layer of Mg:Ag alloy, (iv) a layer of Al:Li alloy, (v) a layer of Al:LiF mixture, or (vi) a layer of LiF coated with a layer of Al, and [B] a conductive transparent region comprising, for instance, ITO or ZnO), and; (4) a MOML. Optionally, the cathode includes a transparent protective capping layer (e.g. SiO, $SiO_2$, $ZrO_2$, or $Al_2O_3$). In the above embodiment, the MOML containing region is a single layer consisting of the MOML; in addition, the MOML of this embodiment can be either conductive or non-conductive.

General Discussion of Display Devices Incorporating MOML(s)

The exact nature of those MOML embodiments that are electrically conductive and at the same time reflection-reducing is still unclear. One possibility could be that the inorganic metal containing material and the organic material undergo phase segregation and subsequently form separate domains (i.e., metal-rich domains and organic-rich domains). Another possibility could be that the inorganic metal containing material and the organic material form a completely miscible solid solution of the two materials, or even interact on the molecular/atomic level and form new species, which provides the observed features. It is also possible that the inorganic metal containing material is transformed into a conductive light-absorbing metal compound during the physical vapor deposition ("PVD") process that may be utilized in forming the MOML or during contact with the organic material in the MOML. In that regard, a number of metal compounds is known to be electrically conductive and light absorbing. Therefore, it is perceived that mixtures of organic materials and conductive light absorbing metal compounds perhaps can be used to provide embodiments of the MOML.

The MOML in embodiments possesses a generally uniform composition across the entire MOML thickness. To achieve the generally uniform composition, the MOML can be prepared by using a "controlled mixing ratio method" (e.g., spin coating and co-deposition). Thus, in embodiments, the MOML is a mixture of controlled composition, in the sense that the mixing ratio of the different components is controlled to certain levels by means of controlling for instance the evaporation rate of each of the different components which are evaporated from separate evaporation sources simultaneously. In embodiments, the ratios of the different components in the MOML generally stay the same and do not change with time (i.e., ratios of the components in the MOML if measured immediately after fabrication will be equal to their ratios a few days later and longer).

In other embodiments, the MOML may have a non-uniform composition across the entire MOML thickness. Co-deposition can be used to produce the non-uniform composition of the MOML (e.g., by varying the co-deposition rates of the MOML materials during formation of the MOML). Due to intra-layer diffusion or inter-layer diffusion, there may occur in certain embodiments of the MOML a change from a generally uniform composition (when prepared by a "controlled mixing ratio method") to a non-uniform composition over long periods of time. In addition, inter-layer diffusion of materials can be used to prepare the MOML. Diffusion is a less preferred approach for fabricating the MOML for the following reasons: (a) diffusion may require significant time (days, weeks, months, or longer); (b) the mixing ratio changes with time; and (c) one has less control over the desired ratio of MOML materials.

In embodiments of the present invention, the MOML is generally reflection-reducing as well as electrically conductive. An electrically conductive MOML can have a cross-sectional (i.e., across the MOML thickness) ohmic resistance not exceeding, for example, about 100,000 Ohms, and particularly, not exceeding about 5,000 Ohms. In other embodiments, however, the MOML is reflection-reducing but may be considered electrically non-conductive, e.g., possessing an ohmic resistance value somewhere higher than the illustrative range described herein.

In embodiments, the present display device reduces light reflection by at least about 30%, particularly at least about 50%, compared to a display device without any MOML.

Inorganic metal containing materials for the MOML include for example metals and inorganic metal compounds. As used herein, the phrase "metal of the inorganic metal containing material" (where such phrase precedes a list of specific elemental metals) refers to both elemental metals and the metal component of inorganic metal compounds. The metals can be, but are not limited to, for example, Li, Na, K, Rb, Cs, Be, Mg, Ca, Sr, Ba, Sc, Y, La, Ti, Zr, Hf, V, Nb, Ta, Cr, Mo, W, Mn, Tc, Fe, Ru, Os, Co, Rh, Ir, Ni, Pd, Pt, Cu, Ag, Au, Zn, Cd, B, Al, Ga, In, Sn, Pb, Sb, Bi, Se, Te, Ce, Nd, Sm, and Eu. In embodiments of the present invention, the term "metals" includes Sb, Se, and Te. In embodiments, a metal alloy can be used to form the MOML. One metal of the metal alloy is considered the inorganic metal containing material; the other metal or metals of the metal alloy are considered the additional component or components of the MOML. For instance, a binary metal alloy in combination with the organic material would be considered a Ternary MOML.

The inorganic metal compounds for the MOML may be a metal halide (e.g., fluoride, chloride, bromide, iodide), metal oxide, metal hydroxide, metal nitride, metal sulfide, metal carbide, and a metal boride). The metal halides can be, but are not limited to, for example, LiF, LiCl, LiBr, LiI, NaF, NaCl, NaBr, NaI, KF, KCl, KBr, KI, RbF, RbCl, CsF, CsCl, $MgF_2$, $CaF_2$, $SrF_2$, $AlF_3$, AgCl, AgF, and $CuCl_2$. The metal oxides can be, but are not limited to, $Li_2O$, $Ca_2O$, $Cs_2O$, $In_2O_3$, $SnO_2$, ZnO, ITO, $Cu_2O$, CuO, $Ag_2O$, NiO, TiO, $Y_2O_3$, $ZrO_2$, $Cr_2O_3$. The metal hydroxide can be, but is not limited to, for example, AgOH. The metal nitride can be, but is not limited to, LaN, YN and GaN. The metal sulfide can be, but is not limited to, ZnS, $Sb_2S_3$, $Sb_2S_5$, and CdS. The metal carbide can be, but is not limited to, $Li_2C$, FeC and NiC. The metal boride can be, but is not limited to $CaB_6$.

Inorganic materials for the MOML include for example: (i) elemental non-metal materials such as C, Si, and Ge; (ii) inorganic compounds of these elemental non-metal materials such as SiC, SiO, $SiO_2$, $Si_3N_4$; and (iii) inorganic metal compounds such as those described herein. Since there is a separate component category for metals (in the list of components for the MOML), metals are not classified as inorganic materials.

As described herein, some metal compounds are known to be electrically conductive and light absorbing. Mixtures of organic compounds and these metal compounds therefore in embodiments may be able to realize the desired features of the present invention. In embodiments, the inorganic metal containing material for use in the MOML may be a metal compound, particularly metal compounds that may be both electrically conductive and light absorbing such as, for example, $Ag_2O$, $Cu_2O$, CuO, FeO, $Fe_2O_3$, $Fe_3O_4$, NiO, $V_2O_5$, ZnS, ZnO, $In_2O_3$ and $SnO_2$.

Suitable organic materials for the MOML can be for example electroluminescent materials utilized in fabricating the luminescent region of the display device, such electroluminescent materials being described herein. For example, suitable organic materials for the MOML can include molecular (small-molecule) organic compounds such as metal oxinoids, metal chelates, tertiary aromatic amines, indolocarbazoles, porphyrins, phthalocyanines, triazines, anthracenes, and oxadiazoles; and polymeric compounds such as polythiophenes, polyfluorenes, polyphenylenes, polyanilenes, and polyphenylenevinylens. Other organic compounds that can also be used in the MOML include polypolycarbonates, polyethylenes, polystyrenes, organic dyes and pigments (e.g., perinones, coumarines, and other fused aromatic ring compounds).

Embodiments of the present display device encompass the use of one or more MOMLs in any kind of OLEDs, including molecular (small-molecule)-based OLEDs, polymer-based OLEDs, or hybrid OLEDs containing both molecular and polymeric materials in the luminescent region. MOMLs also can be applied to hybrid OLEDs composed of both organic and inorganic materials in the luminescent region. Furthermore, types of display devices encompassed within the present invention include OLEDs, inorganic electroluminescent or phosphor devices, liquid crystal displays, plasma displays, and the like.

Any suitable technique and apparatus can be used to form the MOMLs and the rest of the display device. For example, there may be employed thermal deposition (i.e., physical vapor deposition—"PVD"), spin-coating, sputtering, electron beam, electric arc, chemical vapor deposition ("CVD"), and the like. The first two techniques, and PVD in particular, may be the more desirable approaches. In case of PVD, the MOML can be formed by means of for example co-evaporating the components of the MOML, with the deposition rate of each of the materials independently controlled to achieve the desired mixing ratio. Our studies show that certain ranges of mixing ratio of the different components are more effective in producing the desired characteristics in the MOML. These preferred mixing ratios may be determined on a trial and error basis for specific material combinations. Generally speaking, the MOML can be comprised of from about 5 vol. % to about 95 vol. % of the organic compound and from about 95 vol. % to about 5 vol. % of the inorganic metal containing material. More preferred ranges will depend on the particular materials selected. The phrase "controlled mixing ratio method" refers to spin-coating and co-deposition. Co-deposition refers to thermal deposition (i.e., physical vapor deposition—"PVD"), sputtering, electron beam, electric arc, chemical vapor deposition ("CVD"), and the like.

In embodiments, the MOML can be formed using the following illustrative PVD procedures: (i) co-evaporating the inorganic metal compound, the organic compound, and any optional additional components, (ii) co-evaporating an elemental metal, an organic compound, and any optional additional components, where the elemental metal is transformed into the inorganic metal compound of (i) during the process or in the MOML, or even by (iii) co-evaporating a different inorganic compound of the elemental metal of (ii), an organic compound, and any optional additional components, where that different inorganic metal compound is transformed into the inorganic metal compound of (i) during the process or in the MOML. Alternatively, the MOML can be formed by spin coating of, for example, a polymer solution that contains the inorganic metal containing compound and any other optional components.

The invention will now be described in detail with respect to specific illustrative embodiments thereof, it being understood that these examples are intended to be illustrative only and the invention is not intended to be limited to the materials, conditions, or process parameters recited herein. All percentages and parts are by volume of the MOML unless otherwise indicated.

EXAMPLES 1–51 COMPARATIVE EXAMPLES INDICATED WITH "C"

Examples 1–51 in the first Table below summarizes inventive OLED devices that have been reduced to practice. All devices were fabricated using physical vapor deposition in vacuum ($5 \times 10^{-6}$ Torr) on ITO-coated glass substrates, that were pre-cleaned using UV-ozone cleaning. The numbers in parentheses refer to layer thickness in Angstroms. The reduced reflectance of the inventive devices is observed in the lower values in the "% Reflection" column, in comparison to those of the comparative devices. From the above reduced to practice examples, it is clear that a wide variety of embodiments according to this invention can provide devices with reduced light reflection, in addition to improved device performance as reflected in the shown luminance and voltage values.

EXAMPLES 1A–23A

Examples 1A–23A in the second Table below summarize other inventive OLED devices that can be prepared using the same procedures as for Examples 1–51. The numbers in parentheses refer to layer thickness in Angstroms. Examples 1A–23A are "paper examples" that have not been reduced to practice.

In the tables below, the following are used:

PeDot: Polythiophene;
TPD: N,N'-diphenyl-N,N'-bis(3-methylphenyl)-1,1-biphenyl-4,4'-diamine);
CuPc: Copper Phthalocyanine;
NPB: N,N'-di(naphthalene-1-yl)-N,N'-diphenyl-benzidine);
AlQ3: tris(8-hydroxyquinoline)aluminum;
dopant: any dopant such as C545T and PtOEP;
ITO: Indium-Tin-Oxide;
MeNIC: 2,8-dimethyl-5,11-di-1-naphthyl-5,11-dihydroindolo[3,2-b]carbazole;
T1: 4,4'-bis[2-(4,6-diphenyl-1,3,5-triazinyl)]-1,1'-biphenyl);
Perinone black pigment: Bis(1,8-Naphthimidazo)perinone;
PtOEP: 2,3,7,8,12,13,17,18-octaethyl-21H,23H-porphine platinum (II); and
C545T: 10-2-(benzothiazolyl)-2,3,6,7-tetrahydro-1,1,7,7-tetramethyl-1H, 5H, 11H-(1)benzopyropyrano(6,7,-8-ij) quinolizin-11-one.

Other modifications of the present invention may occur to those skilled in the art based upon a reading of the present disclosure and these modifications are intended to be included within the scope of the present invention.

| Ex. No. | Anode | Luminescent Region | | | Cathode | MOML Composition (ratios in vol. %) | L (cd/m2), V(volts) at 25 mA/cm2 | Emission Color | % Reflection | Remarks |
|---|---|---|---|---|---|---|---|---|---|---|
| | | Hole Transport Zone | Light Emitting Zone | Electron Transport Zone | | | | | | |
| 1C | ITO | MeNIC (600) | AlQ3 | (750) | Mg:Ag(1200)/SiO(900) | — | 945, 6.1 | green | 80 | no MOML |
| 2 | ITO | MeNIC (600) | AlQ3 | (750) | MOML(1500)/ Mg:Ag(1200)/SiO(900) | AlQ3 + Mg + Ag (31:62:7) | 540, 6.6 | green | 25 | |
| 3 | ITO | MeNIC (600) | AlQ3 | (750) | MOML(1500)/ Mg:Ag(1200)/SiO(900) | AlQ3 + Mg + Ag (47:47:6) | 450, 6.7 | green | 10 | |
| 4 | ITO | MeNIC (600) | AlQ3 | (750) | MOML1(1500/MOML2/ Mg:Ag(1200)/SiO(900) | MOML1:AlQ3 + Mg + Ag (47:47:6) MOML2:CuPc + Mg + Ag(31:62:7) | 391, 7.4 | green | 10 | |
| 5 | ITO | MeNIC (600) | AlQ3 | (750) | MOML(1500)/ Mg:Ag(1200)/SiO(900) | CuPc + Mg + Ag (31:62:7) | 650, 6.9 | green | 35 | |
| 6 | ITO | MeNIC (600) | AlQ3 | (750) | MOML(300)/ Mg:Ag(1200)/SiO(900) | AlQ3 + Mg + Ag (47:47:6) | 670, 6.7 | green | 77 | large MOML thickness needed for significant reflection reduction |
| 7 | ITO | MeNIC (600) | AlQ3 | (750) | MOML(1725)/ Mg:Ag(1200)/SiO(900) | AlQ3 + Mg + Ag (47:47:6) | 447, 6.7 | green | 9 | |
| 8 | ITO | MeNIC (600) | AlQ3 | (750) | MOML(1500)/ Mg:Ag(1200)/SiO(900) | T1 + Mg + Ag (47:47:6) | 360, 7.0 | green | Reflection not measured, visual inspection shows reduced reflection | |
| 9 | ITO | MeNIC (600) | AlQ3 (750) | T1(100) | MOML(1500)/ Mg:Ag(1200)/Ag(900) | T1 + Mg + Ag (47:47:6) | 390, 7.2 | green visual | Reflection not measured, inspection shows reduced reflection | measured, |
| 10 | ITO | MeNIC (600) | AlQ3 | (750) | MOML (1500)/ Mg:Ag(1200)/Ag(900) | Perinone black pigment + Mg + Ag (47:47:6) | 420, 7.1 | green | Reflection not measured, visual inspection shows reduced reflection | |
| 11 | ITO | MeNIC:Rubrene (600) | | AlQ3 (750) | MOML(1500)/ Mg:Ag(1200)/Ag(900) | AlQ3 + Mg + Ag (47:47:6) | 730, 7.5 | amber | 10 | |
| 12 | ITO | MeNIC:Rubrene (600) | | AlQ3 (750) | MOML(1500)/ Mg:Ag(1200)/Ag(900) | AlQ3 + Ag (92:8) | 480, 11.7 | amber | 9 | |
| 13 | ITO | MeNIC:Rubrene (600) | | AlQ3 (750) | MOML(1500)/ Mg:Ag(1200)/Ag(900) | AlQ3 + Ag (80:20) | 469, 9.3 | amber | 8 | |
| 14 | ITO | MeNIC:Rubrene (600) | | AlQ3 (750) | MOML(1030)/ Mg:Ag(1200)/Ag(900) | AlQ3 + Ag + LiF (75:19:6) | 245, 10.5 | amber | 8 | |
| 15C | ITO | NPB (200) | NPB + AlQ3 + 0.6% C545T(800) | AlQ3 (200) | Mg:Ag(1200)/Ag(900) | — | 2000, 7.1 | green | 82 | no MOML |

TABLE-continued

| # | Anode | HTL | EML | ETL | Cathode/MOML | Organic | Lum, V | Color | Life | Comments |
|---|---|---|---|---|---|---|---|---|---|---|
| 16 | ITO | NPB (200) | NPB + AlQ3 + 0.6% C545T(800) | AlQ3 (200) | MOML(1500)/ Mg:Ag(1200)/Ag(900) | AlQ3 + Mg + Ag (47:47:6) | 1000, 7.1 | green | 10 | |
| 17C | ITO | NPB (200) | NPB + AlQ3 + 12% PtOEP(1100) | AlQ3 (200) | Mg:Ag(1200)/Ag(900) | — | 370, 8.9 | red | 82 | no MOML |
| 18 | ITO | NPB (200) | NPB + AlQ3 + 12% PtOEP(1100) | AlQ3 (200) | MOML(1500)/ Mg:Ag(1200)/Ag(900) | AlQ3 + Mg + Ag (47:47:6) | 190, 8.9 | red | 10 | |
| 19C | ITO | MeNIC (600) | AlQ3 | (750) | Ag + SiO(30:70)(1500)/ Ag(500) | No organic compound. Not in accordance with the invention | — | — | — | OLED did not work. |
| 20C | ITO | MeNIC (600) | AlQ3 | (750) | MOML(1500)/ Mg:Ag(1200)/Ag(900) | AlQ3 + Mg (50:50) | 100, 19.7 | green | 82 | Not all binary mixtures can form conductive, reflection reducing MOML |
| 21 | ITO | MeNIC (600) | AlQ3 | (750) | MOML(6000)/Ag(2000) | AlQ3 + Mg + Ag (47:47:6) | 450, 6.7 | green | 10 | |
| 22 | ITO | MeNIC (600) | AlQ3 | (750) | MOML(1500)/In(100)/ Ag(1500)/In(1500) | AlQ3 + Mg + Ag (47:47:6) | 450, 6.7 | green | 10 | |
| 23 | ITO | MeNIC (600) | AlQ3 | (750) | MOML(2500) | AlQ3 + Mg + Ag (21:71:8) | 470, 7.1 | green | Reflection not measured, visual inspection shows reduced reflection | |
| 24 | ITO | MeNIC (600) | AlQ3 | (750) | MOML1 (500)/ MOML2(2000) | MOML1: AlQ3 + Mg + Ag (47:47:6) MOML2: CuPc + Mg + Ag (21:71:8) | 391, 7.4 | green | Reflection not measured, visual inspection shows reduced, | no capping region on MOML |
| 25 | ITO | MeNIC (600) | AlQ3 | (750) | Mg:Ag(15)/ MOML(1500)/ Mg:Ag(1200)/ SiO(900) | AlQ3 + Mg + Ag (47:47:6) | 470, 6.7 | green | 14 | |
| 26 | ITO | MeNIC (600) | AlQ3 | (750) | Mg:Ag(45)/ MOML(1500)/ Mg:Ag(1200)/ SiO(900) | AlQ3 + Mg + Ag (47:47:6) | 490, 6.7 | green | 20 | |
| 27 | ITO | NPB (600) | AlQ3 | (750) | LiF(10)/Al(20)/ MOML(1500)/ Mg:Ag(1200)/Al(900) | AlQ3 + Mg + Ag (47:47:6) | 342, 10.4 | green | Reflection not measured, visual inspection shows reduced reflection | no capping region on MOML |
| 28 | ITO | NPB (600) | AlQ3 | (750) | LiF(10)/MOML(1500)/ Mg:Ag(1200)/Al(900) | AlQ3 + Mg + Ag (47:47:6) | 376, 8.5 | green | Reflection not measured, visual inspection shows reduced reflection | |

| | | | | | | | |
|---|---|---|---|---|---|---|---|
| 29 | ITO | NPB (600) | AlQ3 | (750) | LiF(10)/Mg(20)/ MOML(1500)/ Mg:Ag(1200)/Al(900) | AlQ3 + Mg + Ag (47:47:6) | 385, 8.7 | green | Reflection not measured visual inspection shows reduced reflection | |
| 30 | ITO | NPB (600) | AlQ3 | (750) | Mg(20)/MOML(1500)/ Mg:Ag(1200)/Al(900) | AlQ3 + Mg + Ag (47:47:6) | 368, 9.2 | green | Reflection not measured, visual inspection shows reduced reflection | measured |
| 31 | ITO | NPB (600) | AlQ3 | (750) | MOML(1500)/ Mg:Ag(1200)/Al(900) | AlQ3 + Mg + Ag (47:47:6) | 375, 9.3 | green | Reflection not measured, visual inspection shows reduced reflection | |
| 32 | ITO | NPB(100)/ MOML(500)/ NPB(600) | AlQ3 | (750) | Mg:Ag(1200)/Ag(900) | NPB + Mg + Ag (47:47:6) | 10, 16.6 | green | Reflection not measured, visual inspection shows reduced reflection | MOML in the hole transport zone |
| 33 | ITO | CuPc(250)/ MOML(1000)/ CuPc(250)/ NPB(600) | AlQ3 | (750) | Mg:Ag(1200)/Ag(900) | CuPc + Ag(96:4) | 95, 24.5 | green | Reflection not measured, visual inspection shows reduced reflection | MOML in the hole transport zone |
| 34 | ITO | CuPc(150)/ NPB(300) | SBPA(300) | TA(100)/ Alq3(100) | MOML(1500)/ Mg:Ag(1200)/SiO(900) | AlQ3 + Mg + Ag(47:47:6) | 350, 9.2 | blue | Reflection not measure, visual inspection shows reduced reflection | |
| 35 | ITO | NPB (600) | AlQ3 | (750) | MOML(1500)/ Mg:Ag(1200)/Ag(900) | AlQ3 + Mg + Ag(47:47:6) | 324, 8.4 | green | 10 | |
| 36 | ITO | NPB (600) | AlQ3 | 750 | LiF(10)/MOML(1500)/ Mg:Ag(1200)/Ag(900) | AlQ3 + Mg + Ag(47:47:6) | 363, 7.1 | green | 10 | |
| 37 | ITO | NPB (600) | AlQ3 | (750) | LiF(10)/MOML1 (1200)/ MOML2(1500)/ Mg:Ag(1200)/Ag(900) | MOML1:AlQ3 + Ag(80:20) MOML2:AlQ3 + Mg +Ag(47:47:6) | 363, 7.1 335, 6.8 | green green | 10 8 | |
| 38 | ITO | NPB (600) | AlQ3 | (750) | MOML1 (300) MOML2 (1200) MOML3(1500) Mg:Ag(1200)/Ag(900) | MOML1&MOML3: AlQ3 + Mg + Ag(47:47:6) MOML2:AlQ3 + Ag(80:20) | 340, 8.2 | green | 9 | Three MOMLs |
| 39 | ITO | NPB (600) | AlQ3 | (750) | Ca(50)/MOML (1500)/ Mg:Ag(1200)/Ag(900) | AlQ3 + Mg+ Ag(47:47:6) | 348, 7.95 | green | 11 | |
| 40 | ITO | NPB (600) | AlQ3 | (750) | LiF(10)/MOML(2500)/ Ag(2000) | AlQ3 + Ag(80:20) | 266, 8.8 | green | 7 | |

-continued

| Ex. No | Anode | Hole Transport Zone | Light Emitting Zone | Electron Transport Zone | Cathode | MOML Composition | | | Remarks |
|---|---|---|---|---|---|---|---|---|---|
| 41 | ITO | NPB (600) | AlQ3 | (750) | LiF(10)/MOML(2500)/Ag(2000) | AlQ3 + Ag(65:35) | 275, 8.8 | green | 10 | |
| 42 | ITO | NPB (600) | AlQ3 | (750) | MOML(2500)/Ag(2000) | AlQ3(65:35) | 222, 10.0 | green | 7 | |
| 43 | ITO | NPB (600) | AlQ3 | (750) | MOML1(100)/MOML2(2500)/Ag(2000) | MOML:AlQ3 + Mg + Ag(47:47:6) | 351, 7.5 | green | 9 | |
| 44 | ITO | NPB (600) | AlQ3 | (750) | LiF(10)/MOML1(100)/MOML2(2500)/Ag(2000) | MOML1:AlQ3 + Mg + Ag(47:47:6) MOML2:AlQ3 (65:35) | 396, 6.6 | green | 10 | |
| 45 | ITO | NPB (600) | AlQ3 | (750) | MOML1(1000)/MOML2(1500)/Mg:Ag(1200)/Ag(900) | MOML1:AlQ + Ag + LiF(79:19:2) MOML2:AlQ3 + Mg + Ag(47:47:6) | 155, 11.2 | green | 7 | |
| 46 | ITO | NPB (600) | AlQ3 | (750) | LiF(10)/MOML1(1000)/MOML2(1500)/Mg:Ag(1200)/Ag(900) | MOML1:AlQ3 + Ag + LiF(79:19:2) MOML2:AlQ3 + Mg + Ag(47:47:6) | 322, 8.6 | green | 7 | |
| 47 | ITO | NPB (600) | AlQ3 | (750) | MOML(1500)/Mg:Ag(1200)/Ag(900) | AlQ3 + Mg + Ag + LiF(45:45:6:4) | 500, 7.3 | green | 10 | Quaternary MOML |
| 48 | ITO | NPB (600) | AlQ3 | (750) | LiF(10)/MOML(1500)/Mg:Ag(1200)/Ag(900) | AlQ3 + Mg + Ag + LiF(45:45:6:4) | 530, 6.5 | green | 11 | Quaternary MOML |
| 49 | ITO | NPB (600) | AlQ3 | (750) | MOML(1500)/Mg:Ag(1200)/Ag(900) | AlQ3 + Ca + Ag(47:47:6) | 287, 6.8 | green | 25 | |
| 50 | ITO | NPB (600) | AlQ3 | (750) | MOML(1500)/Mg:Ag(1200)/Ag(900) | AlQ3 + Ca + Ag(40:40:20) | 293, 6.5 | green | 20 | |
| 51 | ITO | NPB (600) | AlQ3 | (750) | MOML(1500)/Mg:Ag(1200)/Ag(900) | AlQ3 + Ca + Ag + LiF(39:39:20:2) | 318, 5.7 | green | 23 | Quaternary MOML |

| Ex. No | Anode | Hole Transport Zone | Luminescent Region Light Emitting Zone | Electron Transport Zone | Cathode | MOML Composition | Remarks |
|---|---|---|---|---|---|---|---|
| 1A | ITO | | Polyfluorene (750) | | MOML(1500)/Al(2000) | AlQ3 + Mg + Ag (47:47:6) | Polymeric-OLED |
| 2A | ITO | PeDOT (400) | Polyfluorene (750) | | MOML(1500)/Al(2000) | AlQ3 + Al + LiF + Ag (40:35:5:20) | Polymeric-OLED |
| 3A | ITO | | Polyfluorene (750) | | MOML(1500)/Al(2000) | AlQ3 + Al + Ca + Ag (40:30:10:20) | Polymeric-OLED |
| 4A | ITO | | Polyfluorene (750) | | Al:Li(20)/MOML(1500)/Al(2000) | AlQ3 + Al + Ca + Ag (40:30:10:20) | Polymeric-OLED |
| 5A | ITO | | Polyphenylenevinylene (750) | | MOML(1500)/Al(2000) | AlQ3 + Mg + Ag (47:47:6) | Polymeric-OLED |
| 6A | ITO | | Polyphenylenevinylene (750) | AlQ3 (200) | MOML(1500)/Mg:Ag(1200)/Ag(900) | AlQ3 + Mg + Ag + Ca (40:25:20:15) | Hybrid polymeric-molecular OLED |
| 7A | ITO | | Polyphenylenevinylene (750) | AlQ3 (200) | MOML (1500)/Mg:Ag(1200)/AG(900) | AlQ3 + Mg + Ag + Ca (40:25:20:15) | Hybrid polymeric-molecular OLED |
| 8A | ITO | TPD + MgF2 (600) | AlQ3 | (750) | MOML(1500)/Mg:Ag(1200)/Ag(900) | AlQ3 + Mg + Ag + (47:47:6) | Hybrid organic-inorganic OLED |
| 9A | ITO/MOML(600) | NPB (600) | AlQ3 | (750) | Mg:Ag(1200)/Ag(900) | CuPc + Au(90:10) | MOML in the anode |
| 10A | ITO/MOML(600) | CuPc(150)/ NPB (600) | AlQ3 | (750) | Mg:Ag(1200)/Ag(900) | CuPc + Ag(80:20) | MOML in the anode |
| 11A | ITO/MOML(600) | CuPc(150)/ NPB (600) | AlQ3 | (750) | Mg:Ag(1200)/Ag(900) | CuPc +Cu(80:20) | MOML in the anode |

-continued

| | | | | | |
|---|---|---|---|---|---|
| 12A | ITO/MOML(600) | CuPc(150)/ NPB (600) | AlQ3 | (750) | Mg:Ag(1200)/Ag(900) | CuPc + CuO(80:20) | Organic compound + Metal Compound |
| 13A | ITO | NPB (200) | NPB + AlQ3 + dopant(800) | AlQ3 (200) | MOML(1500)/Mg:Ag (1200)/Ag(900) | AlQ3 + AgO (80:20) | Organic compound + Metal Compound |
| 14A | ITO | NPB (200) | NPB + AlQ3 + dopant(800) | AlQ3 (200) | MOML (1500)/ Mg:Ag (1200)/Ag(900) | AlQ3 + ZnO (80:20) | Organic compound + Metal Compound |
| 15A | ITO | NPB (600) | AlQ3 | (750) | LiF(10)/Al(100)/ MOML(1000)/Al(900) | AlQ3 + Ti(75:25) | MOML comprising Ti |
| 16A | ITO | NPB (600) | AlQ3 | (750) | LiF(10)/Al(100)/ MOML(1000)/Al(900) | AlQ3 + Ni(75:25) | MOML comprising Ni |
| 17A | ITO | NPB (600) | AlQ3 | (750) | Mg:Ag(150)/ITO(800)/ MOML(1000)/Ag(900) | AlQ3 + Mg + Ag(47:47:6) | |
| 18A | ITO | NPB (600) | AlQ3 | (750) | Mg:Ag(150)/ITO(400)/ MOML(800)(800)/MOML (1000)/Ag(900) | | |
| 19A | ITO | NPB (600) | AlQ3 | (750) | Mg:Ag(150)/ITO(400)/ MOML1(300)/ ITO(800)/MOML2(300)/ ITO(800)/Ag(900) | MOML1,MOML2:AlQ3 + Ag(80:20) | multiple, non-adjacent MOML |
| 20A | ITO | NPB (600) | AlQ3 | (750) | LiF(10)/Al(100)/ MOML(1000)/Al(900) | AlQ3 + Se(75:25) | MOML comprising Se |
| 21A | ITO | NPB (600) | AlQ3 | (750) | LiF(10)/Al(100)/ MOML(1000)/Al(900) | AlQ3 + Te(75:25) | MOML comprising Te |
| 22A | ITO | NPB (600) | AlQ3 | (750) | LiF(10)/Al(100)/ MOML(1000)/Al(900) | AlQ3 + Sb$_2$S$_5$(75:25) | MOML comprising Sb sulfide compound |
| 23A | ITO | NPB (600) | AlQ3 | (750) | LiF(10)/Al(100)/ MOML(1000)/Al(900) | AlQ3 + Sb$_2$S$_3$(75:25) | MOML comprising another Sb sulfide compound |

We claim:

1. A display device comprising:
   (a) a cathode;
   (b) an anode; and
   (c) a luminescent region between the cathode and the anode;
   wherein at least one of the cathode, the anode, and the luminescent region comprises a light absorbing binary metal-organic mixed layer consisting of:
      (i) a single inorganic metal containing material, wherein the metal of the inorganic metal containing material is selected from the group consisting of Cu, Ag, Au, Ni, Pd, Pt, Se, and Te, and
      (ii) a single organic material
   wherein the light absorbing metal-organic mixed layer is selected such that the device reduces light reflection by at least about 30%.

2. The device of claim 1, wherein the metal of the inorganic metal containing material is selected from the group consisting of Cu, Ag, and Au.

3. The device of claim 1, wherein the metal of the inorganic metal containing material is selected from the group consisting of Ni, Pd, and Pt.

4. The device of claim 1, wherein the metal of the inorganic metal containing material is selected from the group consisting of Se and Te.

5. The device of claim 1, wherein the cathode includes the metal-organic mixed layer.

6. The device of claim 1, wherein the cathode includes the metal-organic mixed layer and an electron injection region.

7. The device of claim 1, wherein the cathode includes a capping region.

8. The device of claim 1, wherein the luminescent region includes an organic electroluminescent material.

9. The device of claim 1, wherein the luminescent region includes an inorganic electroluminescent material.

10. The device of claim 1, wherein the node includes the metal-organic mixed layer.

11. The device of claim 1, wherein the anode includes the metal-organic mixed layer and a hole injection region.

12. The device of claim 1, wherein the anode includes a capping region.

13. The device of claim 1, wherein the metal of the inorganic metal containing material is Ag and the organic material is tris(8-hydoxyquinoline)aluminum.

14. The device of claim 1, wherein the device reduces light reflection by at least about 50%.

15. The device of claim 1, wherein the cathode is a single layer consisting of the metal-organic mixed layer.

16. The device of claim 1, wherein the anode is a single layer consisting of the metal-organic mixed layer.

17. A display device comprising:
   (a) a cathode;
   (b) an anode;
   (c) a luminescent region between the cathode and the anode; and
   (d) a region adjacent an electrode selected from the group consisting of the cathode and the anode, wherein the region includes a light absorbing metal-organic mixed layer including:
      (i) an inorganic metal containing material,
      (ii) an organic material, and
      (iii) optionally at least one component selected from the group consisting of metals, organic materials, and inorganic materials
   wherein the light absorbing metal-organic mixed layer is selected such that the device reduces light reflection by at least about 30%.

18. The device of claim 17, wherein the metal of the inorganic metal containing material is selected from the group consisting of Li, Na, K, Rb, Cs, Be, Mg, Ca, Sr, Ba, Sc, Y, La, Ti, Zr, Hf, V, Nb, Ta, Cr, Mo, W, Mn, Tc, Fe, Ru, Os, Co, Rh, Ir, Ni, Pd, Pt, Cu, Ag, Au, Zn, Cd, B, Al, Ga, In, Sn, Pb, Sb, Bi, Se, Te, Ce, Nd, Sm, and Eu.

19. The device of claim 17, wherein the electrode includes a capping region.

20. The device of claim 17, wherein the region is a single layer consisting of the metal-organic mixed layer.

21. The device of claim 17, wherein the region comprises a plurality of layers.

22. The device of claim 17, wherein the electrode is the cathode.

23. The device of claim 17, wherein the electrode is the anode.

24. The device of claim 17, wherein the metal-organic mixed layer includes tris(8-hydroxyquinoline)aluminum and the metal in the inorganic metal containing material is Ag.

25. The device of claim 17, wherein the device reduces light reflection by at least about 50%.

26. A display device comprising:
   (a) a cathode;
   (b) an anode; and
   (c) a luminescent region between the cathode and the anode;
   wherein at least one of the cathode, the anode, and the luminescent region comprises a light absorbing metal-organic mixed layer including:
      (i) an inorganic metal containing material,
      (ii) an organic material, and
      (iii) at least one component selected from the group consisting of metals, organic materials, and inorganic materials
   wherein the light absorbing metal-organic mixed layer is selected such that the device reduces light reflection by at least about 30%.

27. The device of claim 26, wherein the metal of the inorganic metal containing material and the metals are selected from the group consisting of Li, Na, K, Rb, Cs, Be, Mg, Ca, Sr, Ba, Sc, Y, La, Ti, Zr, Hf, V, Nb, Ta, Cr, Mo, W, Mn, Tc, Fe, Ru, Os, Co, Rh, Ir, Ni, Pd, Pt, Cu, Ag, Au, Zn, Cd, B, Al, Ga, In, Sn, Pb, Sb, Bi, Se, Te, Ce, Nd, Sm, and Eu.

28. The device of claim 26, wherein the cathode includes the metal-organic mixed layer.

29. The device of claim 26, wherein the cathode includes the metal-organic mixed layer and an electron injection region.

30. The device of claim 26, wherein the cathode includes a capping region.

31. The device of claim 26, wherein the luminescent region includes an organic electroluminescent material.

32. The device of claim 26, wherein the luminescent region includes an inorganic electroluminescent material.

33. The device of claim 26, wherein the node includes the metal-organic mixed layer.

34. The device of claim 26, wherein the anode includes the metal-organic mixed layer and a hole injection region.

35. The device of claim 26, wherein the anode includes a capping region.

36. The device of claim 26, wherein the cathode includes the metal-organic mixed layer and the metal-organic mixed layer includes tris(8-hydroxyquinoline)aluminum, Ag, and Ca.

37. The device of claim 26, wherein the cathode includes the metal-organic mixed layer and the metal-organic mixed layer includes tris(8-hydroxyquinoline)aluminum, Ag, Ca, and LiF.

38. The device of claim 26, wherein the cathode includes the metal-organic mixed layer and the metal-organic mixed layer includes tris(8-hydroxyquinoline)aluminum, Ag, Mg, and LiF.

39. The device of claim 26, wherein the device reduces light reflection by at least about 50%.

40. The device of claim 26, wherein the cathode is single layer consisting of the metal-organic mixed layer.

41. The device of claim 26, wherein the anode is a single layer consisting of the metal-organic mixed layer.

42. An electroluminescent device comprising
   (a) a cathode;
   (b) an anode; and
   (c) a luminescent region including an organic electroluminescent material between the cathode and the anode;
   wherein the cathode comprises a light absorbing metal-organic mixed layer including:
      (i) a metal,
      (ii) an organic material, and
      (iii) at least one component selected from the group consisting of metals, organic materials, and inorganic materials
   wherein the light absorbing metal-organic mixed layer is selected such that the device reduces light reflection by at least about 30%.

43. The device of claim 42, wherein the cathode includes a plurality of layers with the metal-organic mixed layer being in contact with the luminescent region.

44. The device of claim 42, wherein the metal and the metals are selected from the group consisting of Mg, Ag, Al, In, Ca, Sr, Au, Li, Cr.

45. The device of claim 42, wherein the inorganic materials are selected from the group consisting of SiO, $SiO_2$, LiF, and $MF_2$.

46. The device of claim 42, wherein the organic materials include tris(8-hydroxyquinolinate)aluminum.

47. The device of claim 42, wherein the metal-organic mixed layer includes Mg, tris(8-hydroxyquinolinate) aluminum, and Ag.

48. The device of claim 42, wherein the device reduces light reflection by at least about 50%.

49. The device of claim 42, wherein the cathode is a single layer consisting of the metal-organic mixed layer.

* * * * *